US007825462B2

(12) United States Patent
Tang et al.

(10) Patent No.: US 7,825,462 B2
(45) Date of Patent: Nov. 2, 2010

(54) TRANSISTORS

(75) Inventors: Sanh D. Tang, Boise, ID (US); Gordon Haller, Boise, ID (US); Kris K. Brown, Garden City, ID (US); Tuman Earl Allen, III, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 12/070,078

(22) Filed: Feb. 15, 2008

(65) Prior Publication Data
US 2008/0142882 A1 Jun. 19, 2008

Related U.S. Application Data

(63) Continuation of application No. 10/932,150, filed on Sep. 1, 2004, now Pat. No. 7,547,945.

(51) Int. Cl.
H01L 29/76 (2006.01)
(52) U.S. Cl. .................. 257/330; 257/296; 257/401; 257/E29.26; 257/E29.262
(58) Field of Classification Search ............... 257/330, 257/296, 401, E29.26, E29.262; 438/259, 438/270, 271, 589
See application file for complete search history.

(56) References Cited

U.S. PATENT DOCUMENTS

| 4,455,740 | A | 6/1984 | Iwai |
| 4,835,741 | A | 5/1989 | Baglee |
| 4,922,460 | A | 5/1990 | Furutani et al. |
| 4,931,409 | A | 6/1990 | Nakajima et al. |
| 4,937,641 | A | 6/1990 | Sunami et al. |
| 4,979,004 | A | 12/1990 | Esquivel et al. |
| 5,013,680 | A | 5/1991 | Lowrey et al. |
| 5,014,110 | A | 5/1991 | Satoh |
| 5,021,355 | A | 6/1991 | Dhong et al. |
| 5,047,117 | A | 9/1991 | Roberts |
| 5,107,459 | A | 4/1992 | Chu et al. |
| 5,108,938 | A | 4/1992 | Solomon |
| 5,122,848 | A | 6/1992 | Lee et al. |
| 5,160,491 | A | 11/1992 | Mori |
| 5,254,218 | A | 10/1993 | Roberts et al. |

(Continued)

FOREIGN PATENT DOCUMENTS

DE 04408764 9/1994

(Continued)

OTHER PUBLICATIONS

Impact of a Verticle-Shape Transistor Cell for 1 Gbit DRAM and Beyond; 8093 IEEE Transactions on Electron Devices; 42(1995) Dec. No. 12, New York, NY, US; Dec. 12, 1995.

(Continued)

Primary Examiner—Tu-Tu V Ho
(74) Attorney, Agent, or Firm—Wells St. John PS

(57) ABSTRACT

The invention includes a transistor device having a semiconductor substrate with an upper surface. A pair of source/drain regions are formed within the semiconductor substrate and a channel region is formed within the semiconductor substrate and extends generally perpendicularly relative to the upper surface of the semiconductor substrate. A gate is formed within the semiconductor substrate between the pair of the source/drain regions.

14 Claims, 26 Drawing Sheets

U.S. PATENT DOCUMENTS

| | | | |
|---|---|---|---|
| 5,281,548 A | 1/1994 | Prall | |
| 5,358,879 A | 10/1994 | Brady et al. | |
| 5,371,024 A | 12/1994 | Hieda et al. | |
| 5,376,575 A | 12/1994 | Kim et al. | |
| 5,392,237 A | 2/1995 | Iida | |
| 5,413,949 A | 5/1995 | Hong | |
| 5,446,299 A | 8/1995 | Acovic et al. | |
| 5,472,893 A | 12/1995 | Iida | |
| 5,480,838 A * | 1/1996 | Mitsui | 438/270 |
| 5,502,320 A | 3/1996 | Yamada et al. | |
| 5,504,357 A | 4/1996 | Kim et al. | |
| 5,512,770 A | 4/1996 | Hong | |
| 5,514,604 A | 5/1996 | Brown | |
| 5,573,837 A | 11/1996 | Roberts et al. | |
| 5,574,621 A | 11/1996 | Sakamoto et al. | |
| 5,612,559 A | 3/1997 | Park et al. | |
| 5,619,057 A | 4/1997 | Komatsu | |
| 5,693,549 A | 12/1997 | Kim | |
| 5,714,412 A | 2/1998 | Liang et al. | |
| 5,714,786 A | 2/1998 | Gonzalez et al. | |
| 5,724,032 A | 3/1998 | Alavi et al. | |
| 5,739,066 A | 4/1998 | Pan | |
| 5,753,947 A | 5/1998 | Gonzalez | |
| 5,763,305 A | 6/1998 | Chao | |
| 5,792,687 A | 8/1998 | Jeng et al. | |
| 5,792,690 A | 8/1998 | Sung | |
| 5,798,544 A | 8/1998 | Ohya et al. | |
| 5,817,552 A | 10/1998 | Roesner et al. | |
| 5,841,611 A | 11/1998 | Sakakima et al. | |
| 5,869,359 A | 2/1999 | Prabhakar | |
| 5,909,618 A | 6/1999 | Forbes et al. | |
| 5,963,469 A | 10/1999 | Forbes | |
| 5,972,754 A | 10/1999 | Ni et al. | |
| 5,977,579 A | 11/1999 | Noble | |
| 6,005,273 A | 12/1999 | Gonzalez et al. | |
| 6,015,990 A | 1/2000 | Hieda et al. | |
| 6,033,963 A | 3/2000 | Huang et al. | |
| 6,054,355 A | 4/2000 | Inumiya et al. | |
| 6,072,209 A | 6/2000 | Noble et al. | |
| 6,090,693 A | 7/2000 | Gonzalez et al. | |
| 6,096,596 A | 8/2000 | Gonzalez | |
| 6,114,735 A | 9/2000 | Batra et al. | |
| 6,124,611 A | 9/2000 | Mori | |
| 6,127,699 A | 10/2000 | Ni et al. | |
| 6,150,687 A | 11/2000 | Noble et al. | |
| 6,168,996 B1 | 1/2001 | Numazawa et al. | |
| 6,184,086 B1 | 2/2001 | Kao | |
| 6,187,643 B1 | 2/2001 | Borland | |
| 6,191,470 B1 | 2/2001 | Forbes et al. | |
| 6,215,149 B1 | 4/2001 | Lee et al. | |
| 6,225,669 B1 | 5/2001 | Long et al. | |
| 6,255,165 B1 | 7/2001 | Thurgate et al. | |
| 6,259,142 B1 | 7/2001 | Dawson et al. | |
| 6,297,106 B1 | 10/2001 | Pan et al. | |
| 6,300,177 B1 | 10/2001 | Sundaresan et al. | |
| 6,323,506 B1 | 11/2001 | Alok | |
| 6,337,497 B1 | 1/2002 | Hanafi et al. | |
| 6,340,614 B1 | 1/2002 | Tseng | |
| 6,348,385 B1 | 2/2002 | Cha et al. | |
| 6,349,052 B1 | 2/2002 | Hofmann et al. | |
| 6,362,506 B1 | 3/2002 | Miyai | |
| 6,301,726 B1 | 5/2002 | Manning | |
| 6,383,879 B1 | 5/2002 | Kizilyalli et al. | |
| 6,391,726 B1 | 5/2002 | Manning | |
| 6,414,356 B1 | 7/2002 | Forbes et al. | |
| 6,417,085 B1 | 7/2002 | Batra et al. | |
| 6,420,786 B1 | 7/2002 | Gonzalez et al. | |
| 6,476,444 B1 | 11/2002 | Min | |
| 6,495,474 B1 | 12/2002 | Rafferty et al. | |
| 6,495,890 B1 | 12/2002 | Ono | |
| 6,498,062 B2 | 12/2002 | Durcan et al. | |
| 6,552,401 B1 | 4/2003 | Dennison | |
| 6,563,183 B1 | 5/2003 | En et al. | |
| 6,566,193 B2 | 5/2003 | Hofmann et al. | |
| 6,573,559 B2 | 6/2003 | Kitada et al. | |
| 6,586,808 B1 | 7/2003 | Xiang et al. | |
| 6,630,720 B1 | 10/2003 | Maszara et al. | |
| 6,632,714 B2 | 10/2003 | Yoshikawa | |
| 6,632,723 B2 | 10/2003 | Watanabe et al. | |
| 6,696,746 B1 | 2/2004 | Farrar et al. | |
| 6,717,200 B1 | 4/2004 | Schamberger et al. | |
| 6,727,137 B2 | 4/2004 | Brown | |
| 6,753,228 B2 | 6/2004 | Azam et al. | |
| 6,818,515 B1 | 11/2004 | Lee et al. | |
| 6,818,937 B2 | 11/2004 | Noble et al. | |
| 6,818,947 B2 | 11/2004 | Grebs et al. | |
| 6,844,591 B1 | 1/2005 | Tran | |
| 6,864,536 B2 * | 3/2005 | Lin et al. | 257/355 |
| 6,888,198 B1 | 5/2005 | Krivokapic | |
| 6,888,770 B2 | 5/2005 | Ikehashi | |
| 6,916,711 B2 | 7/2005 | Yoo | |
| 6,924,190 B2 | 8/2005 | Dennison | |
| 6,939,763 B2 | 9/2005 | Schlosser et al. | |
| 6,969,662 B2 | 11/2005 | Fazan et al. | |
| 7,005,710 B1 | 2/2006 | Gonzalez et al. | |
| 7,027,334 B2 | 4/2006 | Ikehashi et al. | |
| 7,030,436 B2 | 4/2006 | Forbes | |
| 7,042,009 B2 | 5/2006 | Shaheen et al. | |
| 7,071,043 B2 | 7/2006 | Tang et al. | |
| 7,091,092 B2 | 8/2006 | Sneelal et al. | |
| 7,122,425 B2 | 10/2006 | Chance et al. | |
| 7,125,774 B2 | 10/2006 | Kim et al. | |
| 7,135,371 B2 | 11/2006 | Han et al. | |
| 7,148,527 B2 | 12/2006 | Kim et al. | |
| 7,214,621 B2 | 5/2007 | Nejad et al. | |
| 7,244,659 B2 | 7/2007 | Tang et al. | |
| 7,262,089 B2 | 8/2007 | Abbott et al. | |
| 7,282,401 B2 | 10/2007 | Juengling | |
| 7,285,812 B2 | 10/2007 | Tang et al. | |
| 7,349,232 B2 | 3/2008 | Wang et al. | |
| 7,361,569 B2 | 4/2008 | Tran et al. | |
| 7,384,849 B2 | 6/2008 | Parekh et al. | |
| 7,390,746 B2 | 6/2008 | Bai et al. | |
| 7,393,789 B2 | 7/2008 | Abatchev et al. | |
| 7,396,781 B2 | 7/2008 | Wells | |
| 7,413,981 B2 | 8/2008 | Tang et al. | |
| 7,429,536 B2 | 9/2008 | Abatchev et al. | |
| 7,435,536 B2 | 10/2008 | Sandhu et al. | |
| 7,455,956 B2 | 11/2008 | Sandhu et al. | |
| 7,465,616 B2 | 12/2008 | Tang et al. | |
| 7,488,685 B2 | 2/2009 | Kewley | |
| 7,547,640 B2 | 6/2009 | Abatchev et al. | |
| 7,547,945 B2 | 6/2009 | Tang et al. | |
| 7,560,390 B2 | 7/2009 | Sant et al. | |
| 7,589,995 B2 | 9/2009 | Tang et al. | |
| 2001/0017390 A1 | 8/2001 | Long et al. | |
| 2001/0025973 A1 | 10/2001 | Yamada et al. | |
| 2001/0038123 A1 | 11/2001 | Yu | |
| 2001/0052617 A1 | 12/2001 | Kitada et al. | |
| 2002/0127796 A1 | 9/2002 | Hofmann et al. | |
| 2002/0127798 A1 | 9/2002 | Prall | |
| 2002/0130378 A1 | 9/2002 | Forbes et al. | |
| 2002/0135030 A1 | 9/2002 | Horikawa | |
| 2002/0153579 A1 | 10/2002 | Yamamoto | |
| 2002/0163039 A1 | 11/2002 | Clevenger et al. | |
| 2002/0192911 A1 | 12/2002 | Parke | |
| 2003/0001290 A1 | 1/2003 | Nitayama et al. | |
| 2003/0011032 A1 | 1/2003 | Umebayashi | |
| 2003/0042512 A1 | 3/2003 | Gonzalez | |
| 2003/0092238 A1 | 5/2003 | Eriguchi | |
| 2003/0094651 A1 | 5/2003 | Suh | |
| 2003/0161201 A1 | 8/2003 | Sommer et al. | |
| 2003/0164527 A1 * | 9/2003 | Sugi et al. | 257/401 |
| 2003/0169629 A1 | 9/2003 | Goebel et al. | |

| | | | |
|---|---|---|---|
| 2003/0170955 A1 | 9/2003 | Kawamura et al. | |
| 2003/0234414 A1 | 12/2003 | Brown | |
| 2004/0009644 A1 | 1/2004 | Suzuki | |
| 2004/0034587 A1 | 2/2004 | Amberson et al. | |
| 2004/0061148 A1 | 4/2004 | Hsu | |
| 2004/0070028 A1 | 4/2004 | Azam et al. | |
| 2004/0125636 A1 | 7/2004 | Kurjanowicz et al. | |
| 2004/0184298 A1 | 9/2004 | Takahashi et al. | |
| 2004/0197995 A1 | 10/2004 | Lee et al. | |
| 2004/0222458 A1 | 11/2004 | Hsieh et al. | |
| 2004/0224476 A1 | 11/2004 | Yamada et al. | |
| 2004/0232466 A1 | 11/2004 | Birner et al. | |
| 2004/0266081 A1 | 12/2004 | Oh et al. | |
| 2005/0017240 A1 | 1/2005 | Fazan | |
| 2005/0042833 A1 | 2/2005 | Park et al. | |
| 2005/0063224 A1 | 3/2005 | Fazan et al. | |
| 2005/0066892 A1* | 3/2005 | Dip et al. ................... | 118/715 |
| 2005/0104156 A1 | 5/2005 | Wasshuber | |
| 2005/0106820 A1 | 5/2005 | Tran | |
| 2005/0106838 A1 | 5/2005 | Lim et al. | |
| 2005/0124130 A1 | 6/2005 | Mathew et al. | |
| 2005/0167751 A1 | 8/2005 | Nakajima et al. | |
| 2006/0043449 A1 | 3/2006 | Tang et al. | |
| 2006/0046407 A1 | 3/2006 | Juengling | |
| 2006/0046424 A1 | 3/2006 | Chance et al. | |
| 2006/0083058 A1 | 4/2006 | Ohsawa | |
| 2006/0167741 A1 | 7/2006 | Ramachandra | |
| 2006/0194410 A1 | 8/2006 | Sugaya | |
| 2006/0216922 A1 | 9/2006 | Tran et al. | |
| 2006/0261393 A1 | 11/2006 | Tang et al. | |
| 2006/0264001 A1 | 11/2006 | Tran et al. | |
| 2007/0001222 A1 | 1/2007 | Orlowski et al. | |
| 2007/0045712 A1 | 3/2007 | Haller et al. | |
| 2007/0048941 A1 | 3/2007 | Tang et al. | |
| 2007/0048942 A1 | 3/2007 | Hanson et al. | |
| 2007/0051997 A1 | 3/2007 | Haller et al. | |
| 2007/0096204 A1 | 5/2007 | Shiratake | |
| 2007/0117310 A1 | 5/2007 | Bai et al. | |
| 2007/0128856 A1 | 6/2007 | Tran et al. | |
| 2007/0138526 A1 | 6/2007 | Tran et al. | |
| 2007/0148984 A1 | 6/2007 | Abatchev et al. | |
| 2007/0158719 A1 | 7/2007 | Wang | |
| 2007/0166920 A1 | 7/2007 | Tang et al. | |
| 2007/0178641 A1 | 8/2007 | Kim et al. | |
| 2007/0238299 A1 | 10/2007 | Niroomand et al. | |
| 2007/0238308 A1 | 10/2007 | Niroomand et al. | |
| 2007/0261016 A1 | 11/2007 | Sandhu et al. | |
| 2008/0012056 A1 | 1/2008 | Gonzalez | |
| 2008/0012070 A1 | 1/2008 | Juengling | |
| 2008/0042179 A1 | 2/2008 | Haller et al. | |
| 2008/0061346 A1 | 3/2008 | Tang et al. | |
| 2008/0099847 A1 | 5/2008 | Tang et al. | |
| 2008/0166856 A1 | 7/2008 | Parekh et al. | |
| 2008/0299774 A1 | 12/2008 | Sandhu et al. | |
| 2008/0311719 A1 | 12/2008 | Tang et al. | |
| 2009/0035655 A1 | 2/2009 | Tran | |
| 2009/0035665 A1 | 2/2009 | Tran | |

FOREIGN PATENT DOCUMENTS

| | | |
|---|---|---|
| DE | 19928781 | 7/2000 |
| EP | 0453998 | 10/1991 |
| EP | 1003219 | 5/2000 |
| EP | 1067597 | 1/2001 |
| EP | 1089344 | 4/2001 |
| EP | 1271632 | 1/2003 |
| EP | 1391939 | 2/2004 |
| JP | 07-106435 | 4/1995 |
| JP | 07-297297 | 11/1995 |
| JP | 11-274478 | 10/1999 |
| KR | 1993-0006930 | 4/1993 |
| KR | 1994-0006679 | 7/1994 |
| TW | 574746 | 2/2004 |
| TW | 200411832 | 7/2004 |
| WO | WO8603341 | 6/1986 |
| WO | WO 97/44826 | 11/1997 |
| WO | WO 02/089182 A2 | 11/2002 |
| WO | WO 02/089182 A3 | 11/2002 |
| WO | PCT/US2004/034587 | 6/2005 |
| WO | WO200585770 | 9/2005 |
| WO | PCT/US2006/008295 | 8/2006 |
| WO | PCT/US2005/030668 | 10/2006 |
| WO | PCT/US2006/031555 | 12/2006 |
| WO | PCT/US2007/001953 | 9/2007 |
| WO | PCT/US2007/014689 | 1/2008 |
| WO | PCT/US2007/016573 | 1/2008 |
| WO | PCT/US2007/014689 | 4/2008 |
| WO | PCT/US2007/001953 | 5/2008 |
| WO | PCT/US2007/023767 | 5/2008 |
| WO | PCT/US2007/001953 | 8/2008 |
| WO | PCT/US2007/019592 | 11/2008 |
| WO | PCT/US2007/016573 | 2/2009 |
| WO | PCT/US2007/019592 | 3/2009 |
| WO | PCT/US2007/023767 | 5/2009 |

OTHER PUBLICATIONS

Abstract: "Bell Labs opens gate to deeper-submicron CMOS", Lammers, Electronic Engineering Times, p. 18, Dec. 6, 1999.
Abstract: "Device Structures Architectures compatible with conventional silicon processes—Vertical transistors plumbed for memory, logic", Clarke, Feb. 14, 2000.
Keast et al., "Silicon Contact Formation and Photoresist Planarization Using Chemical Mechanical Polishing", VMIC Conference, Jun. 1994, pp. 204-205.
Risch et al., "Vertical MOS Transistors with 70 nm Channel Length", IEEE Transactions on Electron Devices, vol. 43, No. 9, Sep. 1996, pp. 1495-1498.
U.S. Appl. No. 12/537,470, filed Aug. 7, 2009, Tang et al.
Barth, "ITRS commodity memory roadmap", IEEE Xplore, Jul. 28, 2003, Abstract.
Bashir et al., "Characterization of sidewall defects in selective epitaxial growth of silicon", American Vacuum Society, May/Jun. 1995, pp. 923-927.
Bashir et al., "Reduction of sidewall defect induced leakage currents by the use of nitrided field oxides in silicon selective epitaxial growth isolation for advanced ultralarge scale integration", American Vacuum Society, Mar./Apr. 2000, pp. 695-699.
Bernstein et al., Chapter 3, 3.4-3.5, SOI Device Electrical Properties, pp. 34-53.
Bhave, et al., "Developer-soluble Gap fill materials for patterning metal trenches in Via-first Dual Damascene process", 2004 Society of Photo-Optical Instrumentation Engineers, Proceedings of SPIE: Advances in Resist Technology and Processing XXI, vol. 5376, 2004.
Chen et al., "The Enhancement of Gate-Induced-Drain-Leakage (GIDL) Current in Short-Channel SOI MOSFET and its Application in Measuring Lateral Bipolar Current Gain B," IEEE Electron Device Letters, vol. 13, No. 11, pp. 572-574 (Nov. 1992).
Choi et al., "Investigation of Gate-Induced Drain Leakage (GIDL) Current in Thin Body Devices: Single-Gate Ultrathin Body, Symmetrical Double-Gate, and Asymmetrical Double-Gate MOSFETs" JPN. J. Appl. Phys., vol. 42, pp. 2073-2076 (2003).
Fazan et al., "MOSFET design simplifies DRAM", EE Times, May 13, 2002, pp. 1-4.
Gonzalez et al., "A dynamic source-drain extension MOSFET using a separately biased conductive spacer", Solid-State Electronics, vol. 46, pp. 1525-1530 (2002).
Hammad et al., "The Pseudo-Two-Dimensional Approach to Model the Drain Section in SOI MOSFETs", 2001 IEEE Transactions on Electron Devices, vol. 48, No. 2, Feb. 2001, pp. 386-387.
Hara, "Toshiba cuts capacitor from DRAM cell design", EE Times, Feb. 7, 2002, pp. 1-3.
Henkels et al., "Large-Signal 2T, 1C DRAM Cell: Signal and Layout Analysis", 1994 IEEE Journal of Solid-State Circuits, Jul. 29, 1994, No. 7, pp. 829-832.

Kim et al., "An Outstanding and Highly Manufacturable 80nm DRAM Technology", IEEE, 2003, 4 pages.

Kim et al., "The Breakthrough in data retention time of DRAM using Recess-Channel-Array Transistor (RCAT) for 88nm feature size and beyond", 2003 Symposium on VLSI Technology Digest of Technical Papers, 2 pages.

Kuo et al., "A Capacitorless Double-Gate DRAM Cell Design for High Density Applications", IEEE, IEDM, pp. 843-846 (2002).

Liu, "Dual-Work-Function Metal Gates by Full Silicidation of Poly-Si with Co-Ni Bi-Layers", 2005 IEEE, vol. 26, No. 4, Apr. 2005, pp. 228-230.

Lusky, et al., "Investigation of Channel Hot Electron Injection by Localized Charge-Trapping Nonvolatile Memory Devices", IEEE Transactions on Electron Devices, vol. 51, No. 3, Mar. 2004, pp. 444-451.

Minami et al., "A Floating Body Cell (FBC) Fully Compatible with 90nm CMOS Technology (CMOS IV) for 128Mb SOI DRAM", IEEE, 2005, 4 pages.

Minami et al., "A High Speed and High Reliability MOSFET Utilizing an Auxiliary Gate", 1990 Symposium on VLSI Technology, IEEE, pp. 41-42 (1990).

Mo et al., "Formation and Properties of ternary silicide (CoxNi1-x) Si2 thin films", 1998 IEEE, pp. 271-274.

Ranica et al., "A One Transistor Cell on Bulk Substrate (1T-Bulk) for Low-Cost and High Density eDRAM", 2004 Symposium on VLSI Technology Digest of Technical Papers, pp. 128-129.

Sivagnaname et al., "Stand-by Current in PD-SOI Pseudo-nMOS Circuits", 2003 IEEE, pp. 95-96.

Sunouchi et al., "Double LDD Concave (DLC) Structure for Sub-Half Micron MOSFET", IEDM, 1988 IEEE, 4 pages.

Tanaka et al., "Scalability Study on a Capacitorless 1T-DRAM: From Single-gate PD-SOI to Double-gate FinDRAM", IEEE, 2004, pp. 37.5.1-37.5.4.

Tiwari et al., "Straddle Gate Transistors: High Ion/Ioll Transistors at Short Gate Lengths", IBM Research Article, pp. 26-27 (pre-Mar. 2006).

Villaret, "Mechanisms of charge modulation in the floating body of triple-well nMOSFET capacitor-less DRAMs", Microelectronic Engineering 72, 2004, pp. 434-439.

Wang et al., "Achieving Low junction capacitance on bulk SI MOSFET using SDOI process", Micron Technology, Inc., 12 pages.

Yoshida et al., "A Capacitorless 1T-DRAM Technology Using Gate-Induced Drain-Leakage (GIDL) Current for Low-Power and High-Speed Embedded Memory", IEEE Transactions on Electron Devices, vol. 53, No. 4, pp. 692-697 (Apr. 2006).

Yoshida et al., "A Design of a Capacitorless 1T-DRAM Cell Using Gate-induced Drain Leakage (GIDL) Current for Low-power and High-speed Embedded Memory", 2003 IEEE, 4 pages.

* cited by examiner

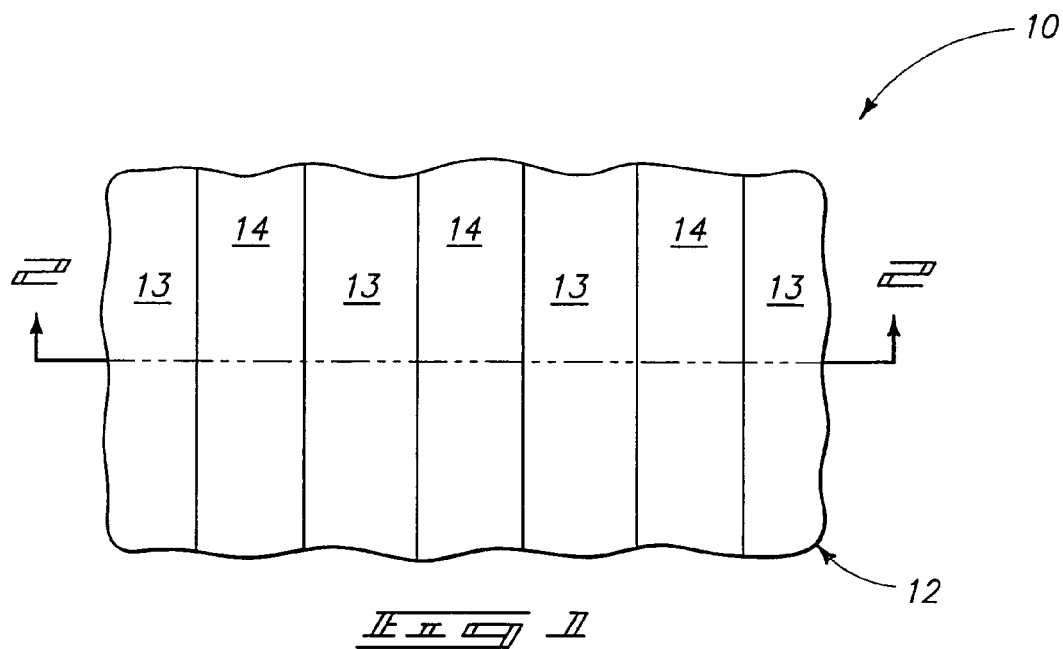
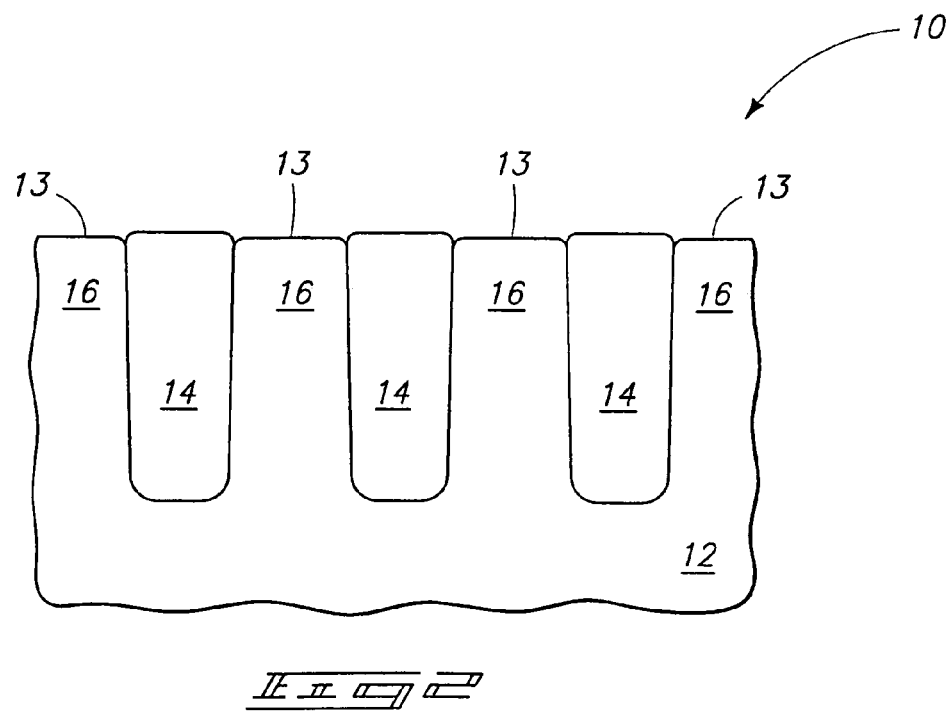

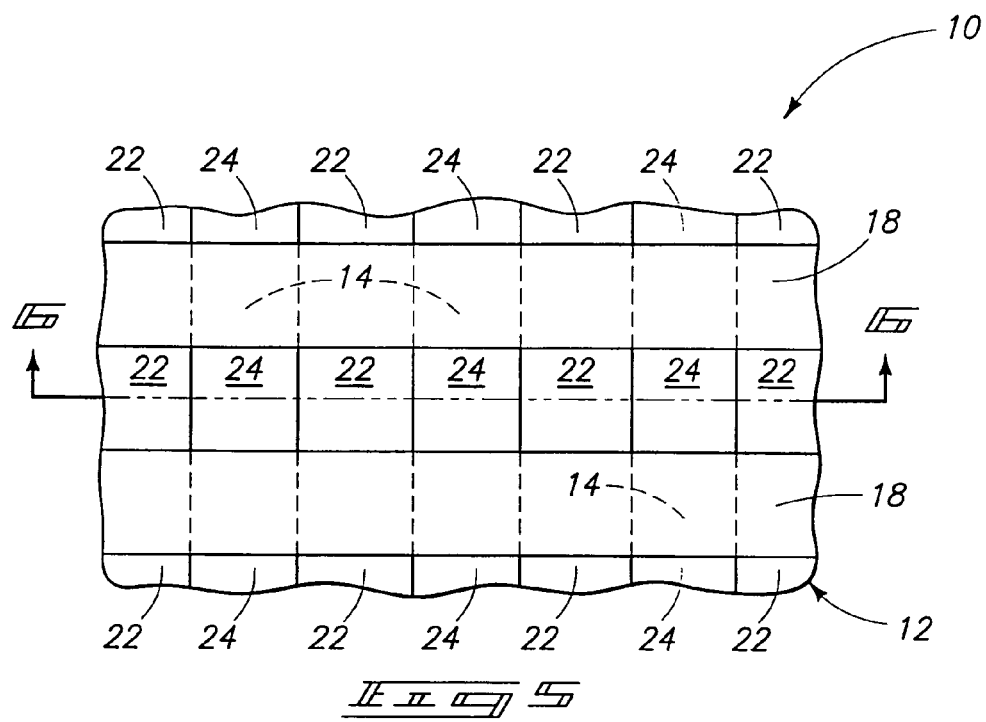
_FIG 5_
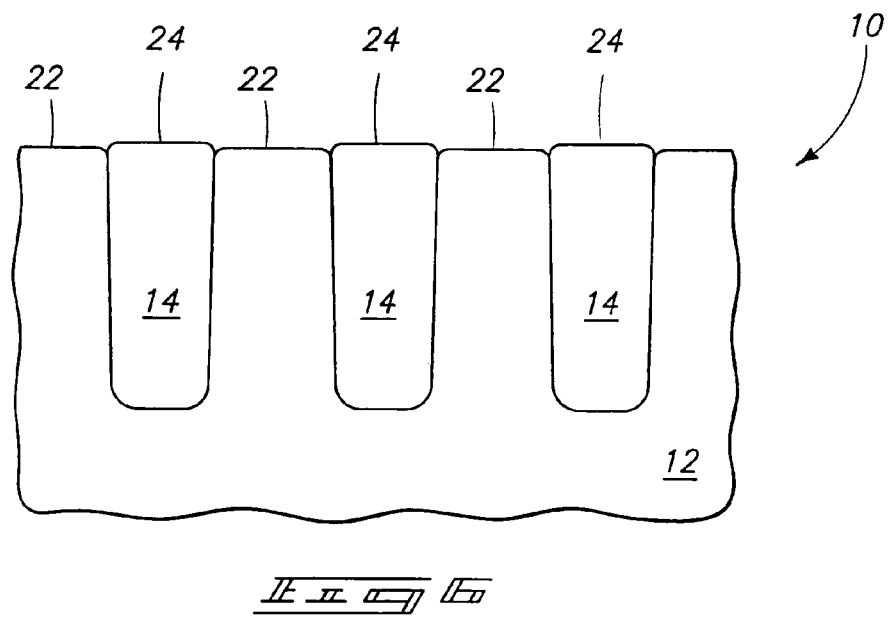
_FIG 6_

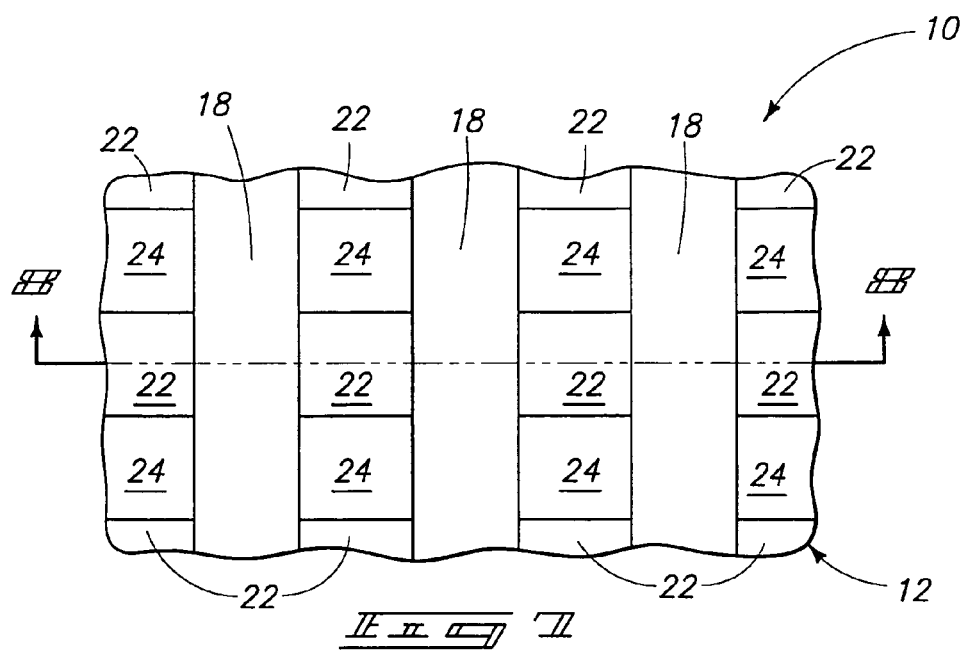
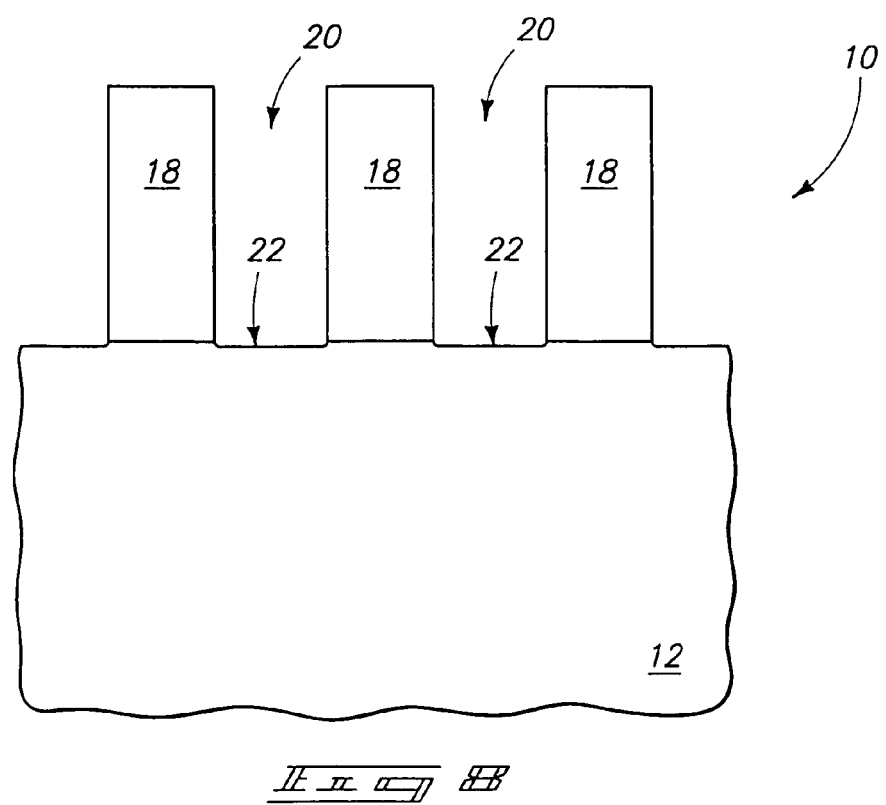

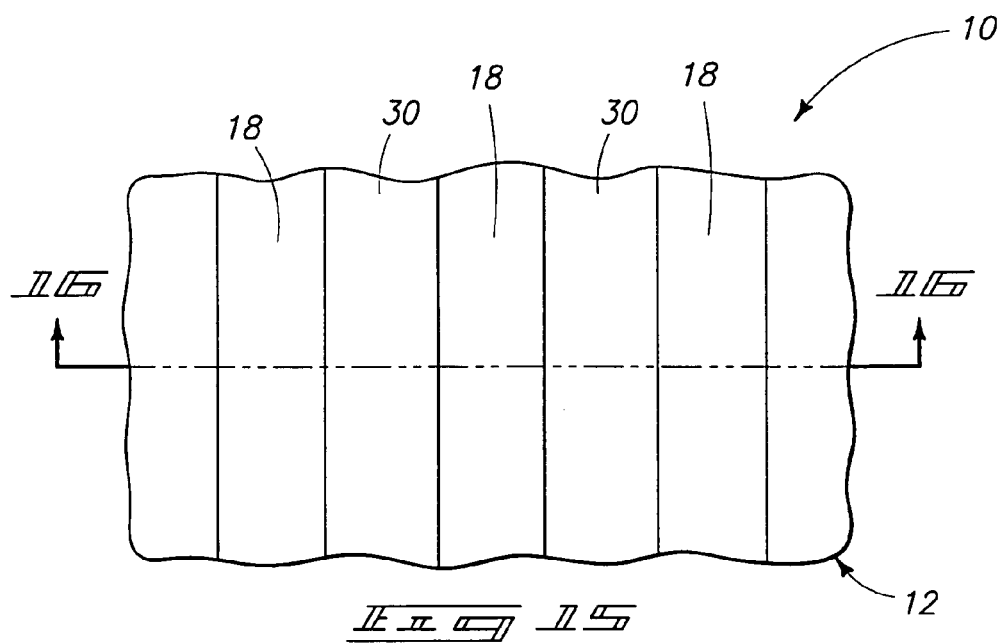
_FIG 15_
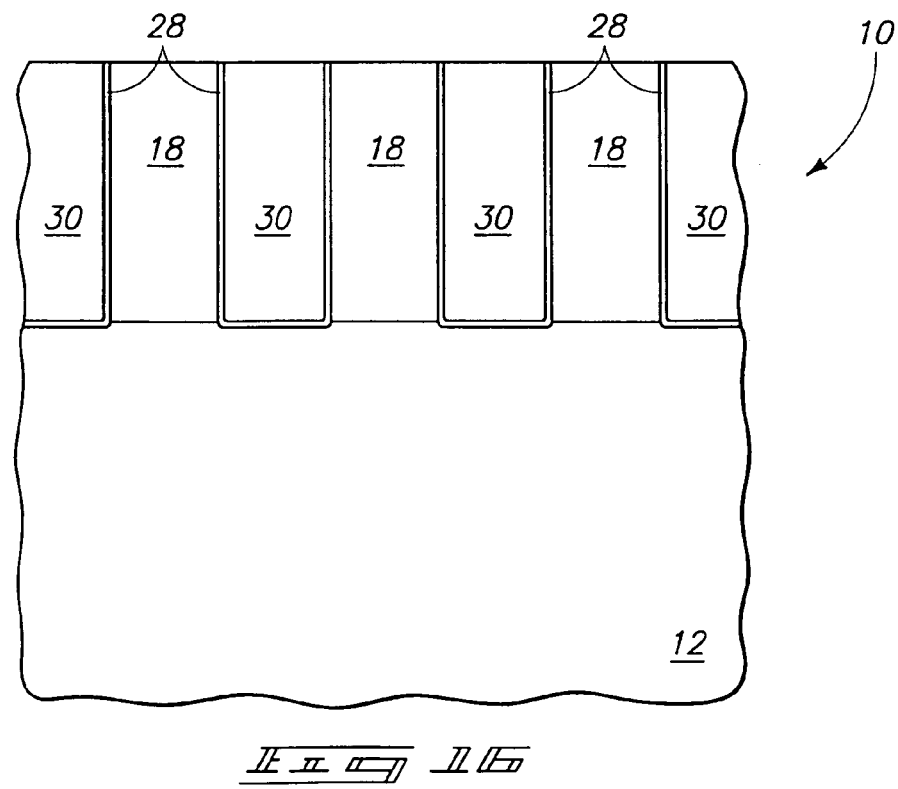
_FIG 16_

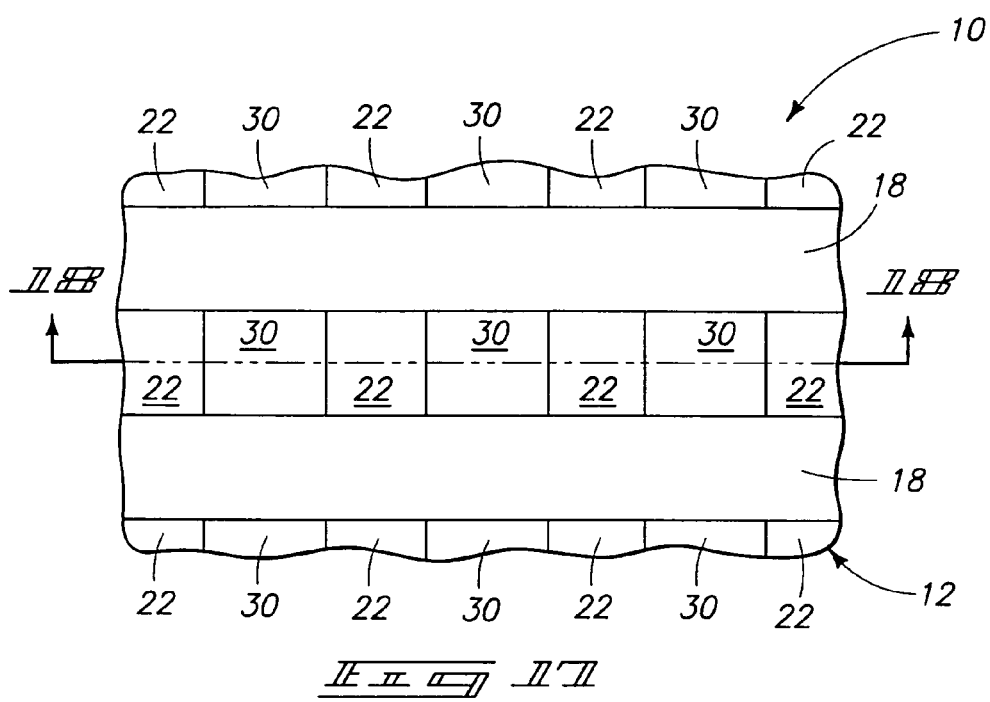
_Fig. 17_
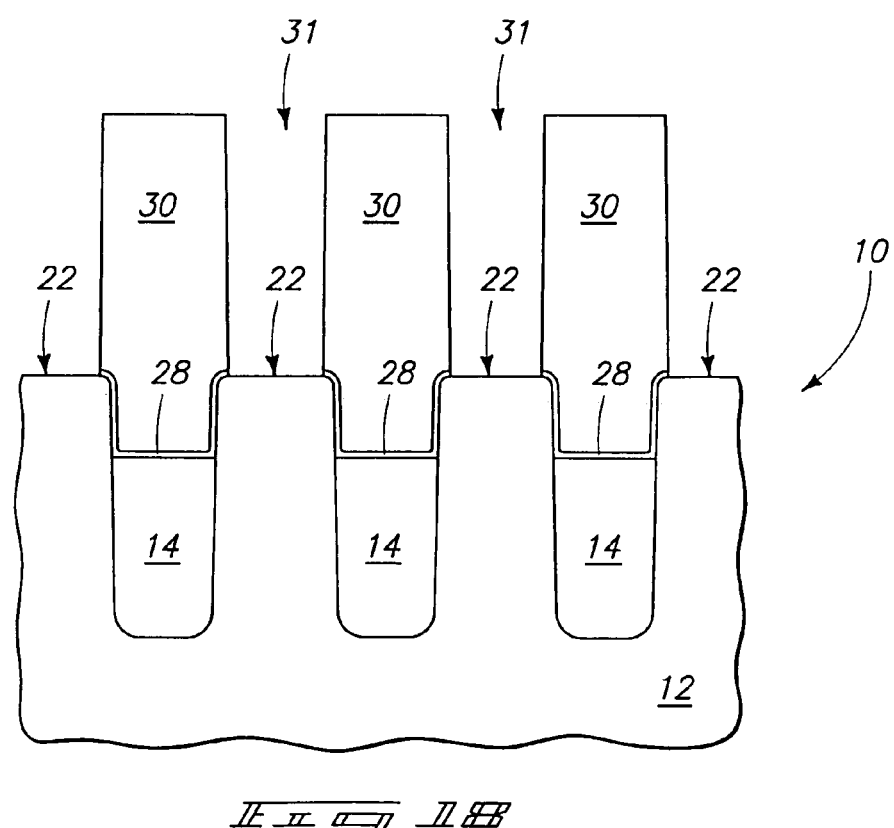
_Fig. 18_

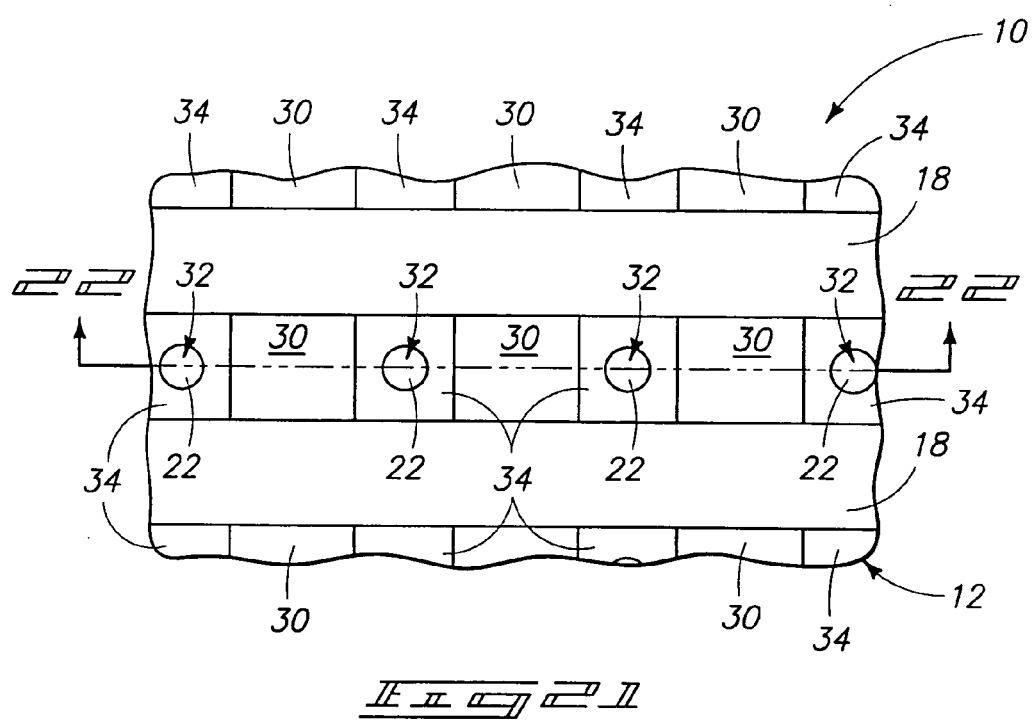
_Fig. 21_
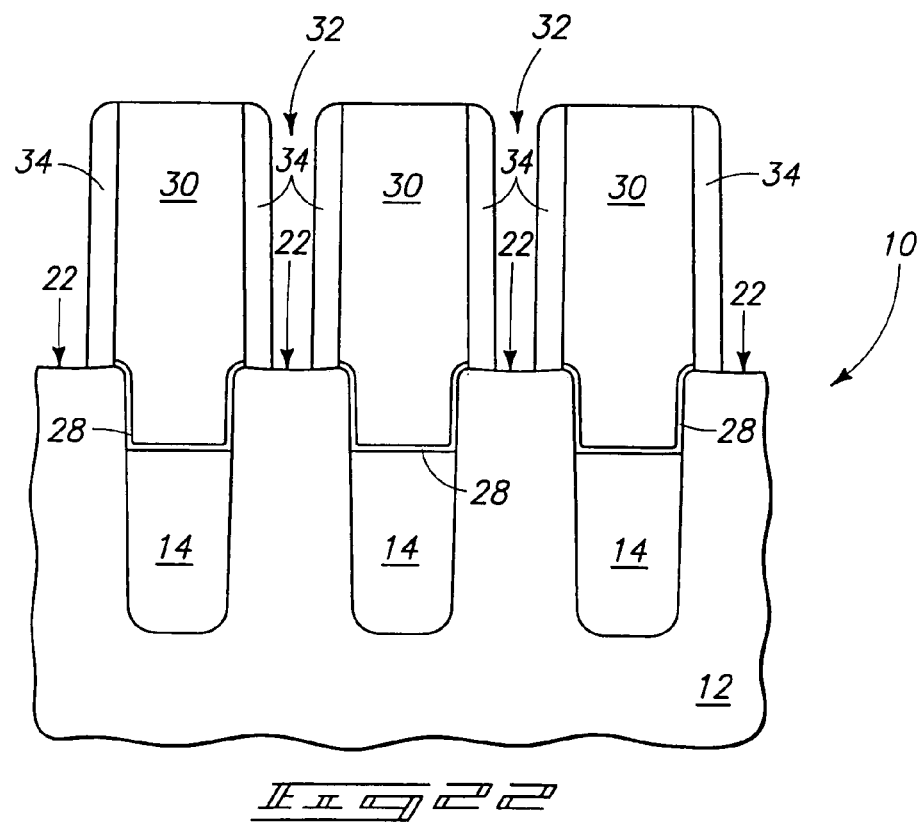
_Fig. 22_

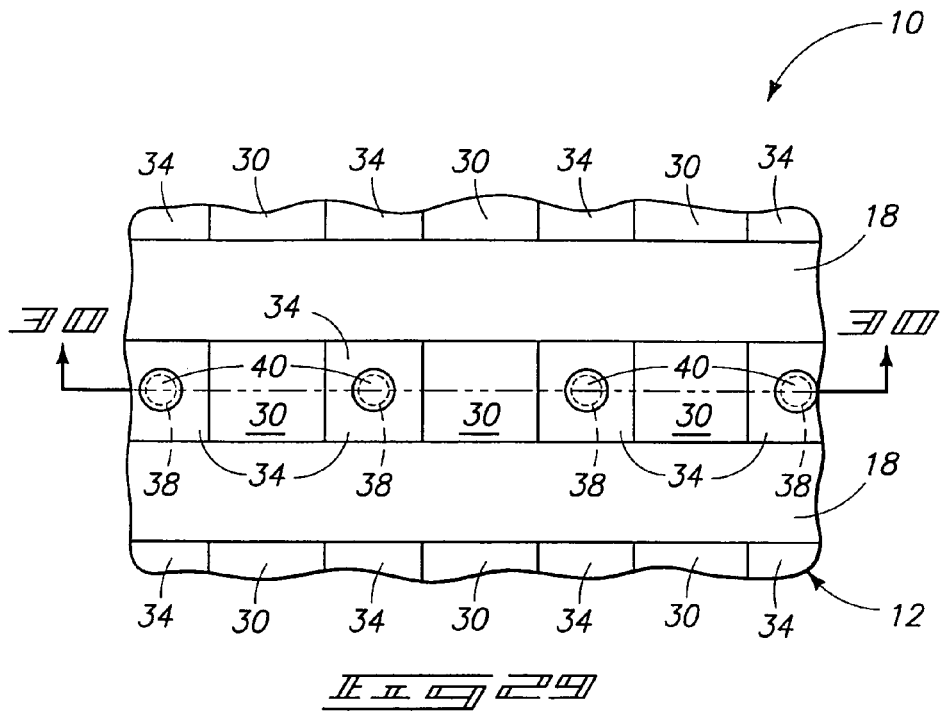
F I G 29
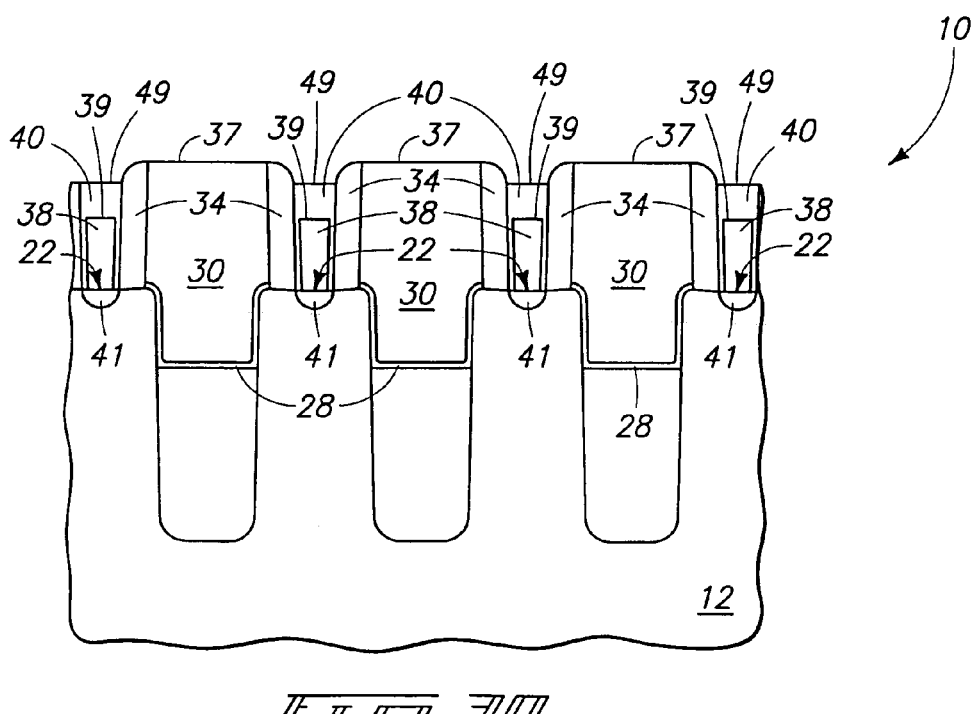
F I G 30

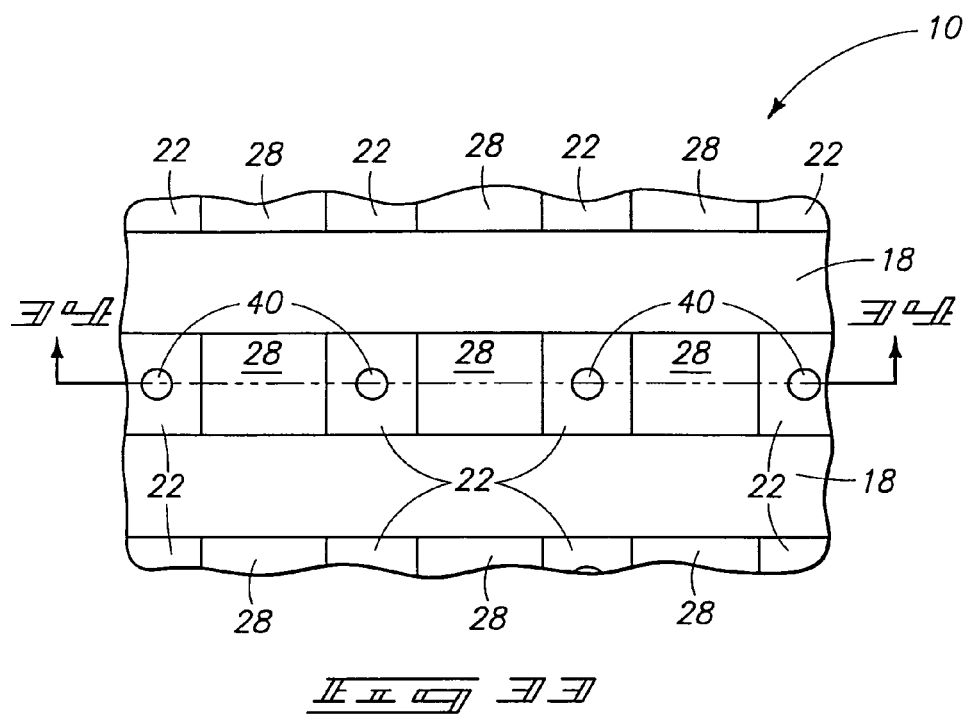
_FIG 33_
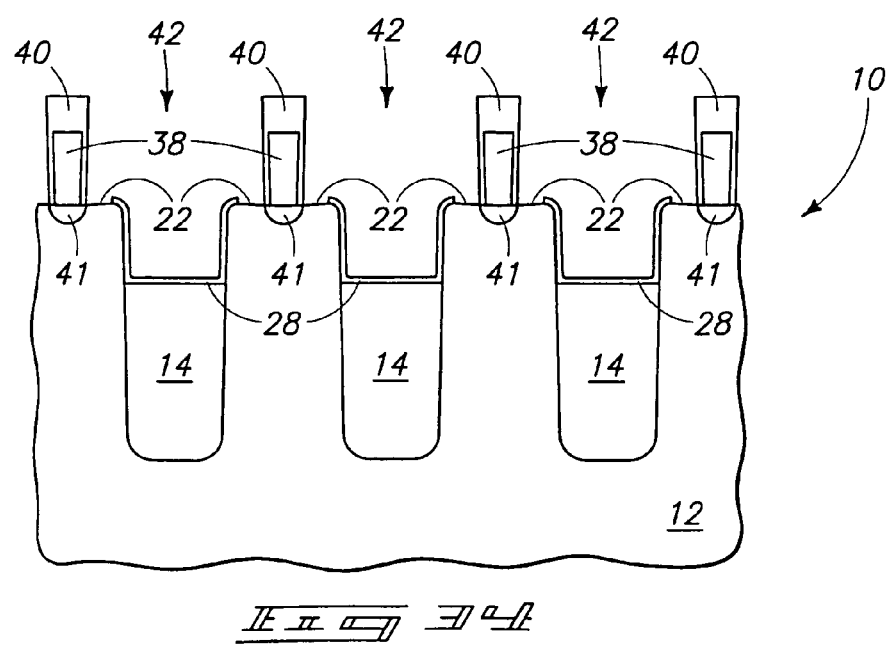
_FIG 34_

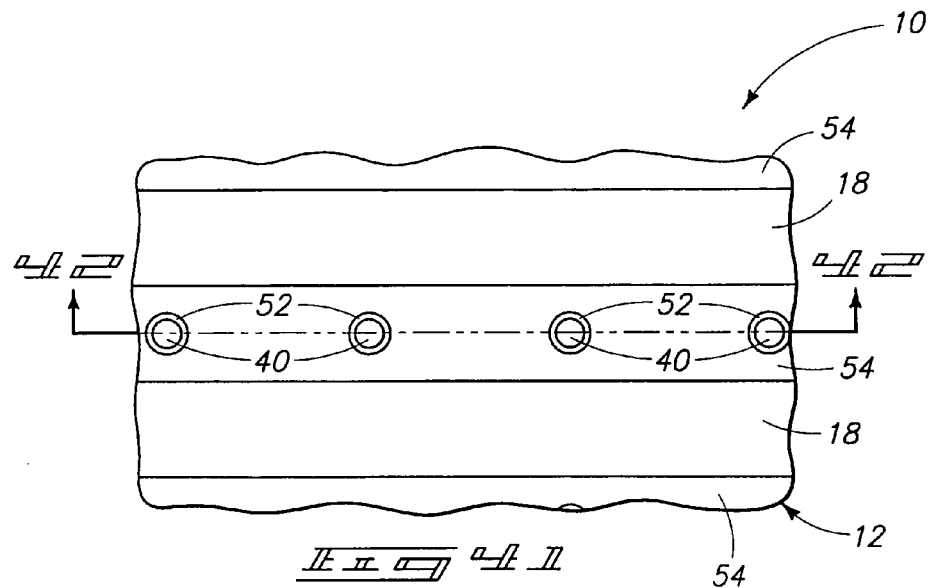
F I G. 41
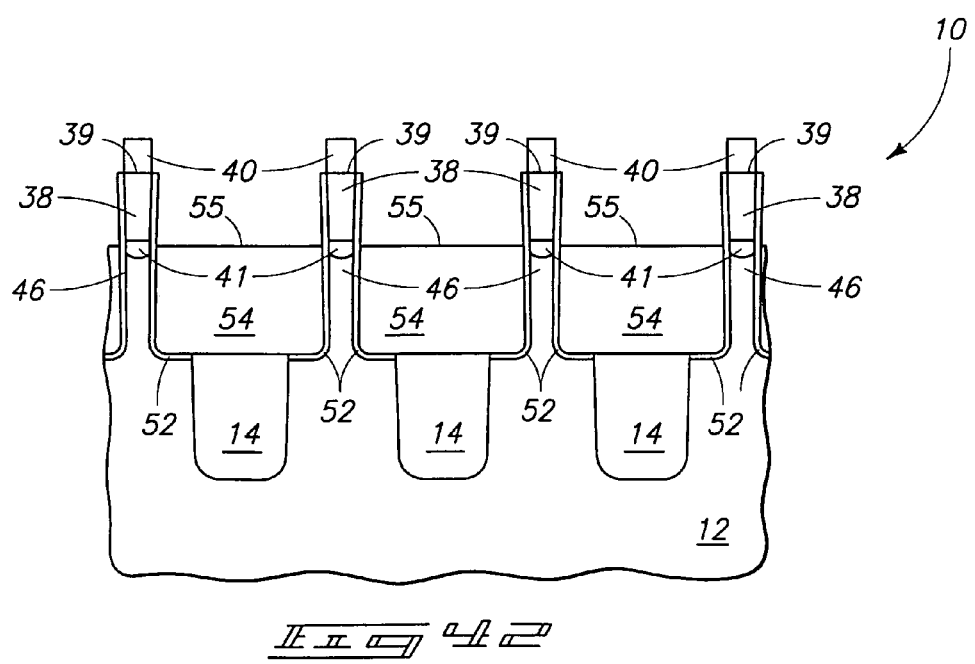
F I G. 42

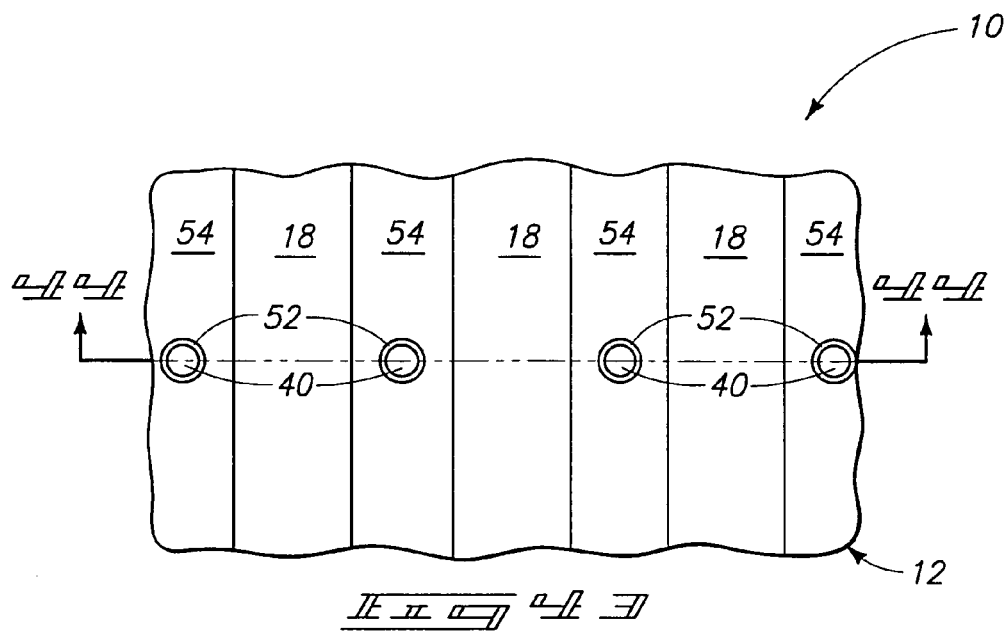
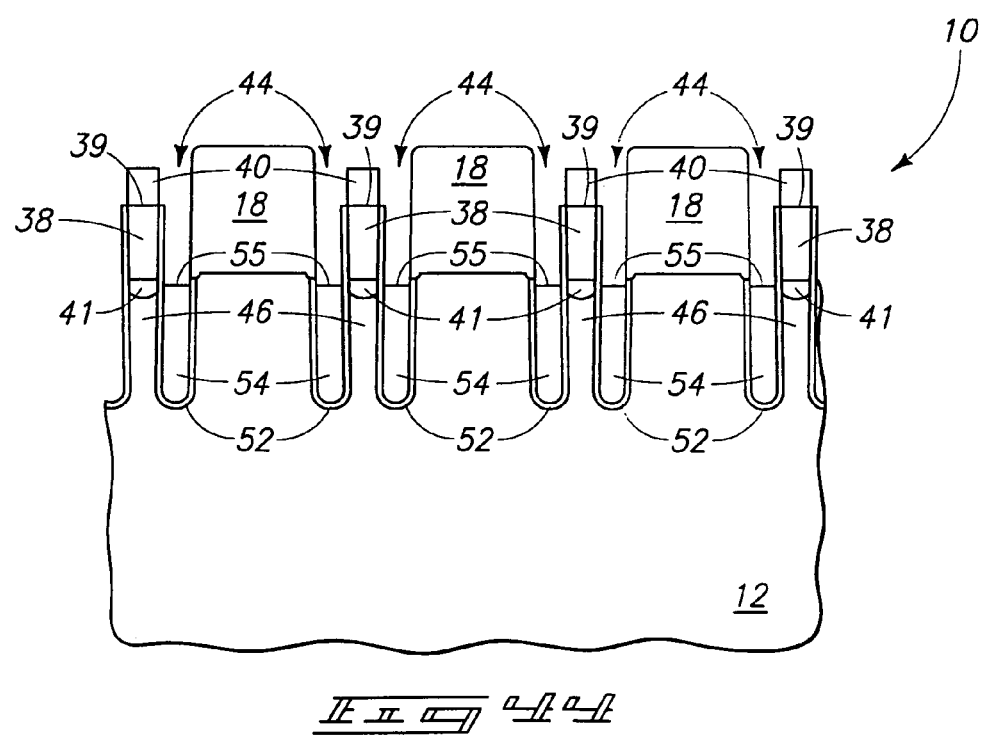

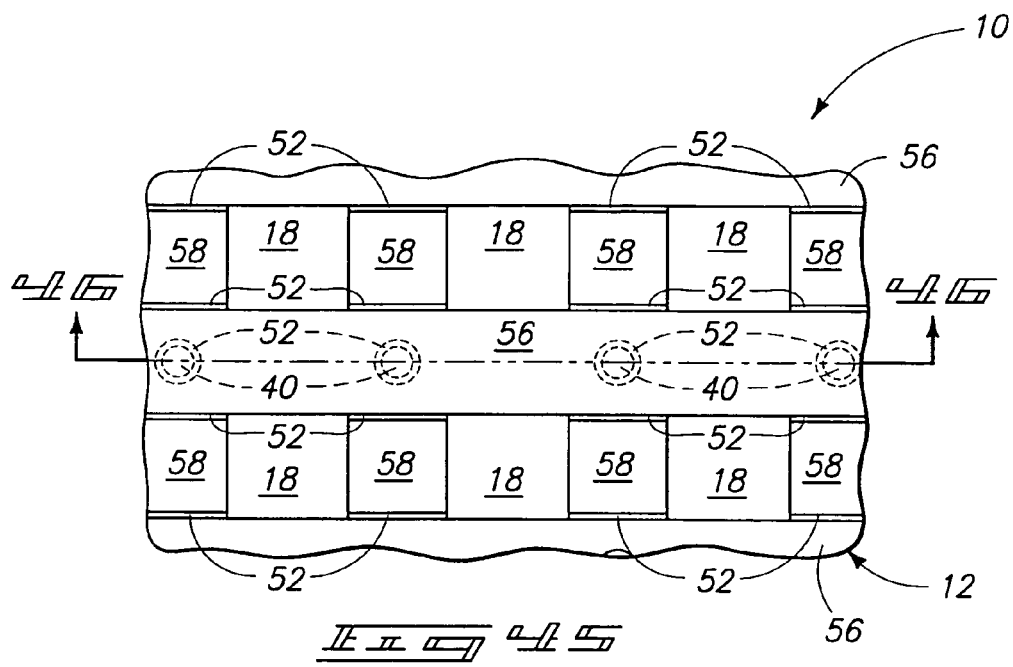
_FIG 45_
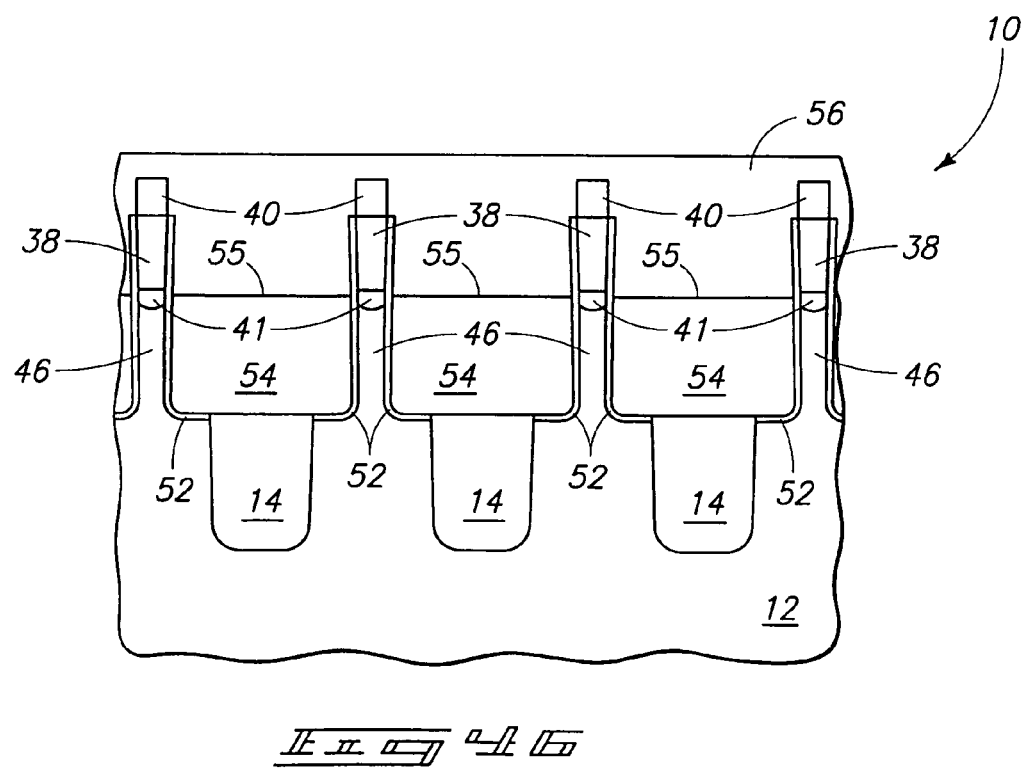
_FIG 46_

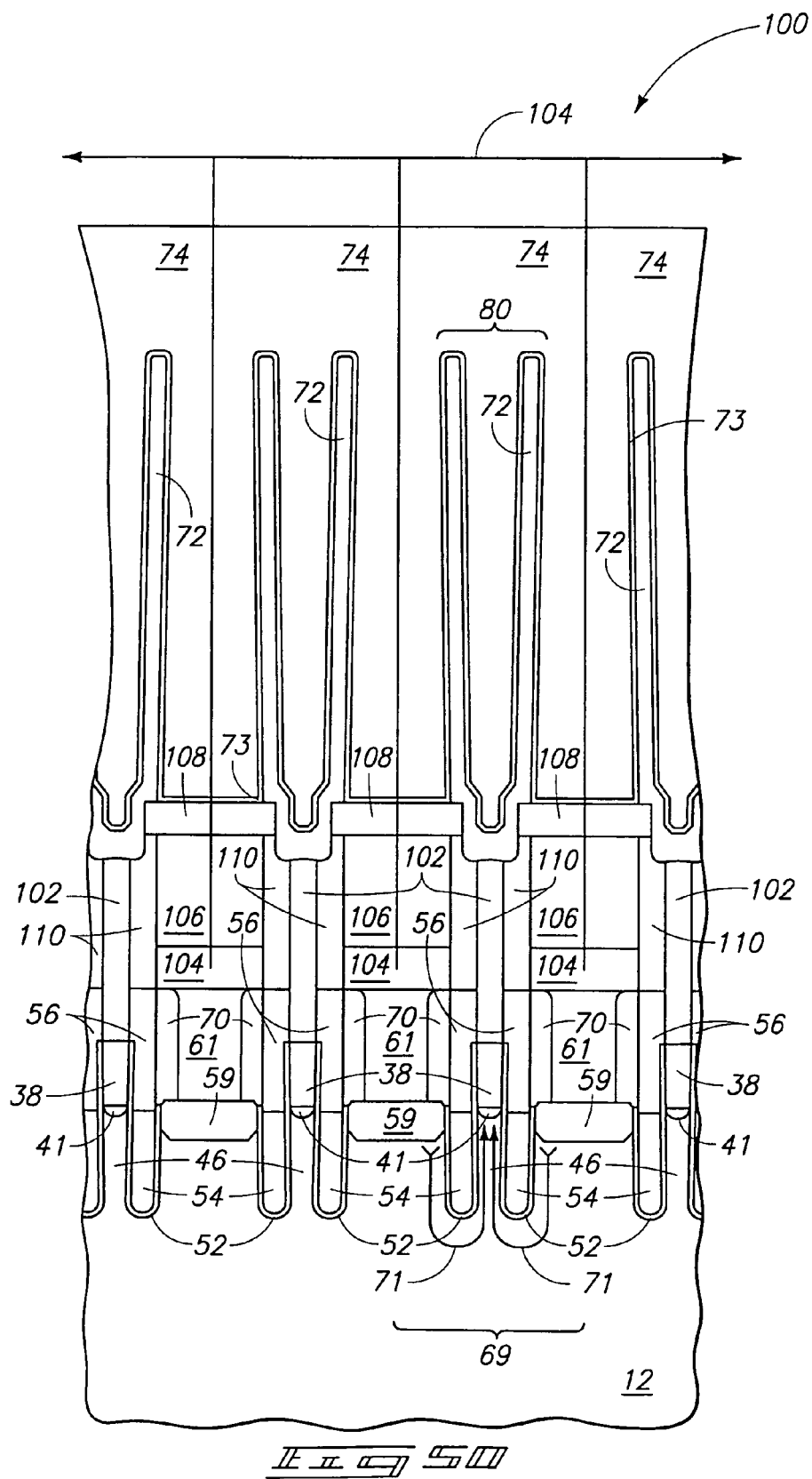
F I G 50

TRANSISTORS

RELATED PATENT DATA

This patent is a continuation application of U.S. patent application Ser. No. 10/932,150, which was filed Sep. 1, 2004; and which is hereby incorporated by reference.

TECHNICAL FIELD

The invention pertains to methods of forming semiconductor constructions such as memory circuitry, and more particularly, to forming memory cells, DRAMs, and transistors.

BACKGROUND OF THE INVENTION

As integrated circuitry continues to shrink in size, efforts are ongoing to find novel methods of forming integrated circuitry structures and related integrated circuitry which improve upon those methods currently utilized and the resultant structures formed thereby. One type of integrated circuitry is memory circuitry and arrays. Such circuitry has been and continues to be the focus of intense efforts to reduce the size of the circuitry, increase the speed with which such circuitry operates, and maintain or increase the ability of such circuitry to perform its memory function. The industry designers continually search for ways to reduce the size of memory circuitry without sacrificing array performance.

One such way is by improving on the design of transistor structures which are incorporated into memory circuitry. Transistor structures or devices have numerous applications for semiconductor circuitry. For instance, transistor structures can be incorporated into memory circuitry (such as, for example, dynamic random access memory (DRAM)) and logic circuitry. DRAM circuitry usually includes an array of memory cells interconnected by rows and columns, which are known as word lines and digit lines (or bit lines), respectively. A typical DRAM memory cell comprises a transistor structure connected with a charge storage device or data storage element (such as, for example, a capacitor device).

Typical transistor structures comprise a channel region between a pair of source/drain regions, and a gate configured to electrically connect the source/drain regions to one another through the channel region. The transistor constructions utilized in semiconductor constructions will be supported by a semiconductor substrate. The semiconductor substrate will have a primary surface which can be considered to define a horizontal direction or horizontal surface. Transistor devices can be divided amongst two broad categories based upon the orientations of the channel regions relative to the primary surface of the semiconductor substrate. Specifically, transistor structures which have channel regions that are primarily parallel to the primary surface of the substrate are referred to as planar transistor structures, and those having channel regions which are generally perpendicular to the primary surface of the substrate are referred to as vertical transistor structures. Since current flow between the source and drain regions of a transistor device occurs through the channel region, planar transistor devices can be distinguished from vertical transistor devices based upon the direction of current flow as well as on the general orientation of the channel region. Specifically, vertical transistor devices are devices in which the current flow between the source and drain regions of the devices is primarily substantially orthogonal to a primary surface of a semiconductor substrate, and planar transistor devices are devices in which the current flow between source and drain regions is primarily parallel to the primary surface of the semiconductor substrate.

There is a continuing interest in the development of methodologies by which vertical transistor devices can be incorporated into integrated circuitry applications due to, among other things, advantages in packing density that can be obtained utilizing vertical transistor devices relative to planar transistor devices. Difficulties are frequently encountered in attempting to produce the vast arrays of vertical transistor devices desired for semiconductor applications while maintaining suitable performance characteristics of the devices. For example, present methodologies for forming vertical transistor devices include forming or growing epitaxial silicon posts or pillars to extend upward from the primary or horizontal surface of the semiconductor substrate. The epitaxial silicon posts or pillars are used as the transistor channels in present designs of vertical transistor devices. However, this design creates several problems. For example, a high defect density has resulted with potential cell leakage issues. Additionally, the design promotes a floating body effect in the transistor channel which complicates and increases the difficulty of controlling the gate threshold voltage of the transistor. Accordingly, it is desired to develop new methods for fabricating vertical transistor devices that improve upon and/or at least diminish or alleviate these problems.

SUMMARY OF THE INVENTION

In one aspect, the invention encompasses a transistor device that includes a semiconductor substrate. The device also includes a gate formed to extend within the semiconductor substrate, a gate dielectric formed over the gate, a pair of source/drain regions formed on opposite sides of the gate, and a channel region formed within the semiconductor substrate.

In another aspect, the invention encompasses a transistor device that includes a semiconductor substrate that has an upper surface. A pair of source/drain regions are formed within the semiconductor substrate. A channel region is formed within the semiconductor substrate and extends generally perpendicularly relative to the upper surface of the semiconductor substrate. A gate is formed between the pair of the source/drain regions.

In still another aspect, the invention encompasses a semiconductor construction that includes a conductive post extending upward from an upper surface of a semiconductor substrate. A source/drain region is formed below the conductive post within the semiconductor substrate and is electrically coupled with the conductive post. A transistor channel extends below the source/drain and a gate is formed within the semiconductor substrate adjacent the transistor channel.

In yet another aspect, the invention encompasses a method of forming a semiconductor construction that includes providing a semiconductor substrate with an opening. An oxide film is formed over the semiconductor substrate within the opening. A conductive gate material is provided over the oxide film and fills the opening. A pair of diffusion regions is formed on opposite sides of the gate material within the semiconductor substrate and a channel region is defined to extend generally vertically within the semiconductor substrate.

BRIEF DESCRIPTION OF THE DRAWINGS

Preferred embodiments of the invention are described below with reference to the following accompanying drawings.

FIG. 1 is a diagrammatic, top plan fragmentary view of a semiconductor construction at a preliminary processing stage of an exemplary aspect of the present invention.

FIG. 2 is a cross-sectional view taken along line 2-2 of the FIG. 1 fragment.

FIG. 5 is a view of the FIG. 3 fragment shown at a processing stage subsequent to that of FIG. 3.

FIG. 6 is a cross-sectional view taken along line 6-6 of the FIG. 5 fragment.

FIG. 7 is a view of the FIG. 5 fragment rotated 90 degrees.

FIG. 8 is a cross-sectional view taken along line 8-8 of the FIG. 7 fragment.

FIG. 15 is a view of the FIG. 13 fragment rotated 90 degrees.

FIG. 16 is a cross-sectional view taken along line 16-16 of the FIG. 15 fragment.

FIG. 17 is a view of the FIG. 13 fragment shown at a processing stage subsequent to that of FIG. 13.

FIG. 18 is a cross-sectional view taken along line 18-18 of the FIG. 17 fragment.

FIG. 21 is a view of the FIG. 17 fragment shown at a processing stage subsequent to that of FIG. 17.

FIG. 22 is a cross-sectional view taken along line 22-22 of the FIG. 21 fragment.

FIG. 29 is a view of the FIG. 25 fragment shown at a processing stage subsequent to that of FIG. 25.

FIG. 30 is a cross-sectional view taken along line 30-30 of the FIG. 29 fragment.

FIG. 33 is a view of the FIG. 29 fragment shown at a processing stage subsequent to that of FIG. 29.

FIG. 34 is a cross-sectional view taken along line 34-34 of the FIG. 33 fragment.

FIG. 41 is a view of the FIG. 37 fragment shown at a processing stage subsequent to that of FIG. 37.

FIG. 42 is a cross-sectional view taken along line 42-42 of the FIG. 41 fragment.

FIG. 43 is a view of the FIG. 41 fragment rotated 90 degrees.

FIG. 44 is a cross-sectional view taken along line 44-44 of the FIG. 43 fragment.

FIG. 45 is a view of the FIG. 41 fragment shown at a processing stage subsequent to that of FIG. 41.

FIG. 46 is a cross-sectional view taken along line 46-46 of the FIG. 45 fragment.

FIG. 50 is a view of the FIG. 49 fragment rotated 90 degrees.

DETAILED DESCRIPTION OF THE PREFERRED EMBODIMENTS

Figure 3:
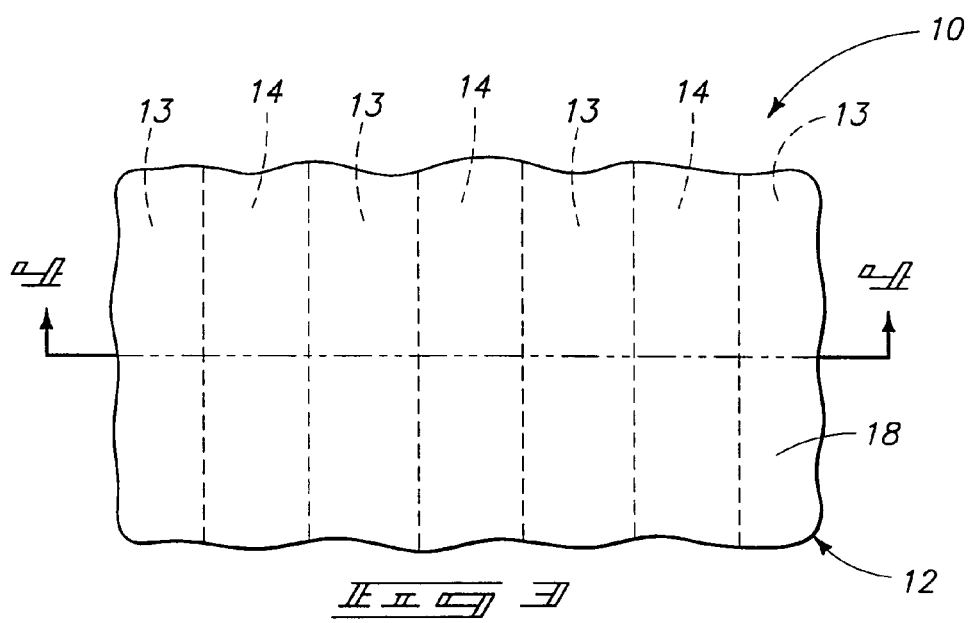
FIG. 3 is a view of the FIG. 1 fragment shown at a processing stage subsequent to that of FIG. 1.

This disclosure of the invention is submitted in furtherance of the constitutional purposes of the U.S. Patent Laws "to promote the progress of science and useful arts" (Article 1, Section 8).

With respect to memory integrated circuitry, the area over a substrate required for each memory cell in a memory array partially determines the capacity of the device. This area is a function of the number of elements in each memory cell and the size of each of the elements. For conventional memory cells, the area is stated to be $8F^2$, where F represents a minimum feature size for photolithographically-defined features and the dimensions of the conventional cell area is 2F by 4F. These memory cell dimensions and areas are readily understood by referring to U.S. Patent Application Publication No. 2003/0234414 A1, published Dec. 25, 2003, the disclosure of which is incorporated herein by reference. U.S. Patent Application Publication No. 2003/0234414 A1 discloses state-of-the-art memory devices wherein the memory cells have cell areas on the order of $4F^2$. By review of the U.S. Patent Application Publication No. 2003/0234414 and comparing such disclosure to the disclosure of the present invention, it should be understood that, the present invention discloses memory circuitry that includes memory cell areas on the order of $4F^2$.

Now referring to FIGS. 1 and 2 (FIG. 2 a cross section of FIG. 1), a semiconductor construction 10 comprises a substrate 12 having a primary surface 13 oriented generally horizontally and is alternatively described as an upper surface. Substrate 12 can comprise, consist essentially of, or consist of a monocrystalline semiconductor material, and in particular aspects will comprise, consist essentially of, or consist of monocrystalline silicon lightly-doped with appropriate background-type dopant. For example, substrate 12 can be a portion of a monocrystalline silicon wafer. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In one exemplary embodiment, substrate 12 comprises a bulk semiconductor substrate or bulk wafer, for example, a monocrystalline silicon substrate or wafer.

Still referring to FIGS. 1-2, isolation regions 14 are formed in substrate 12. In one exemplary embodiment, isolation regions 14 comprise shallow trench isolation (STI) regions. The isolation regions 14 extend generally in parallel and spaced rows leaving regions 16 of substrate 12 between respective rows of isolation regions 14. Regions 16 of substrate 12 are defined by isolation regions 14 and are configured as parallel and spaced rows having upper surfaces 13.

Figure 4:
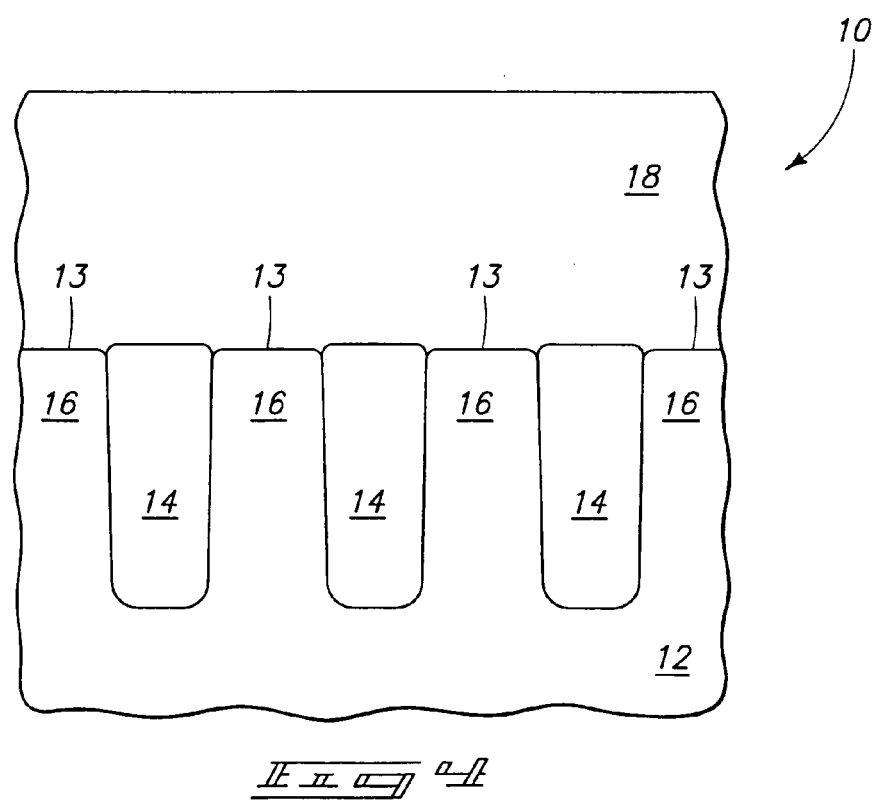
FIG. 4 is a cross-sectional view taken along line 4-4 of the FIG. 3 fragment.
Figure 9:
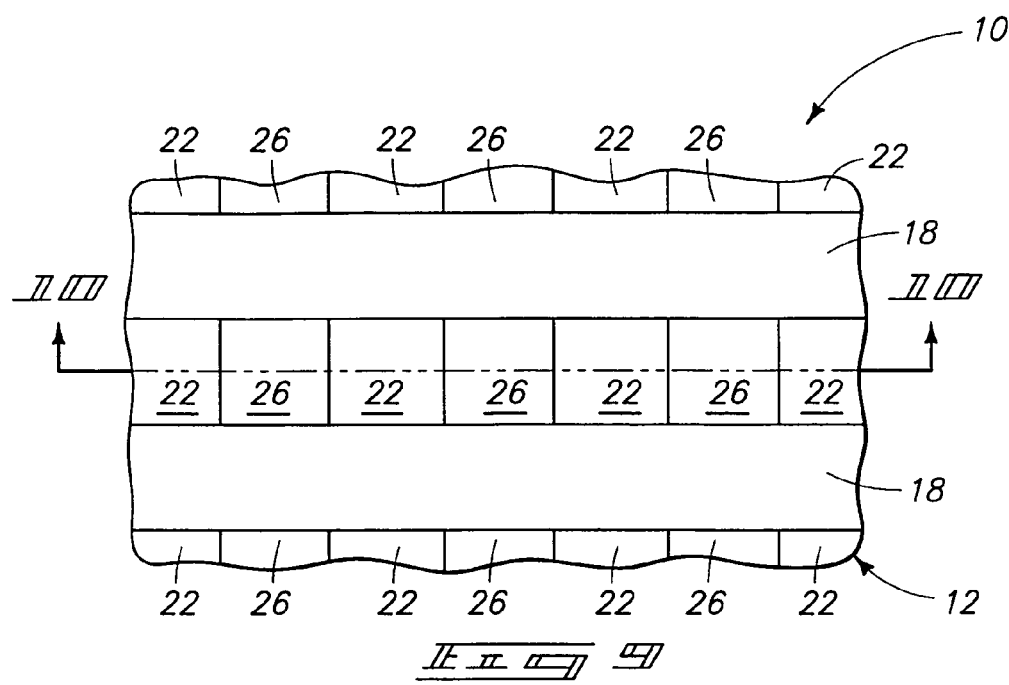
FIG. 9 is a view of the FIG. 5 fragment shown at a processing stage subsequent to that of FIG. 5.

Referring to FIGS. 3 and 4, (FIG. 4 is a cross section of FIG. 3), a nitride layer 18 is deposited over upper surface 13 of substrate 12 and isolations regions 14. An exemplary thickness of nitride layer 18, that is the height in which nitride layer 18 extends upward from upper surface 13, ranges from about 2,000 Angstroms to about 3,000 Angstroms.

Referring to FIGS. 5-8, it should be understood that all four figures represent the same processing step. FIGS. 5-6 represent a first orientation and FIGS. 7-8 represent a second orientation that is oriented 90 degrees from the orientation of FIGS. 5-6. Nitride layer 18 is patterned and etched to form trenches 20 (FIG. 8) that extend down to substrate 12 to expose upper surface portions 22 of substrate 12. Trenches 20 also expose isolation region portions 24 of isolation regions 14. The nitride layer 18 is left patterned as nitride rows or runners 18 that extend generally in a spaced and parallel relation oriented perpendicularly to the direction of the isolation regions 14. Upper surface portions 22 of substrate 12 are generally bounded by isolation region portions 24 of isolation regions 14 and nitride rows 18, and are generally shaped as squares. In one exemplary embodiment, the etching step includes an over-etch of substrate to range from 0 to about 300 angstroms.

Figure 10:
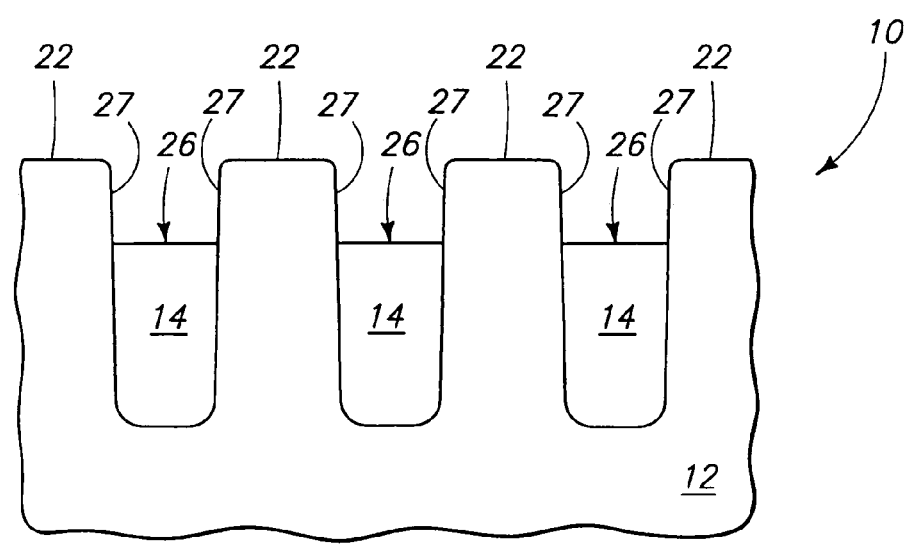
FIG. 10 is a cross-sectional view taken along line 10-10 of the FIG. 9 fragment.
Figure 11:
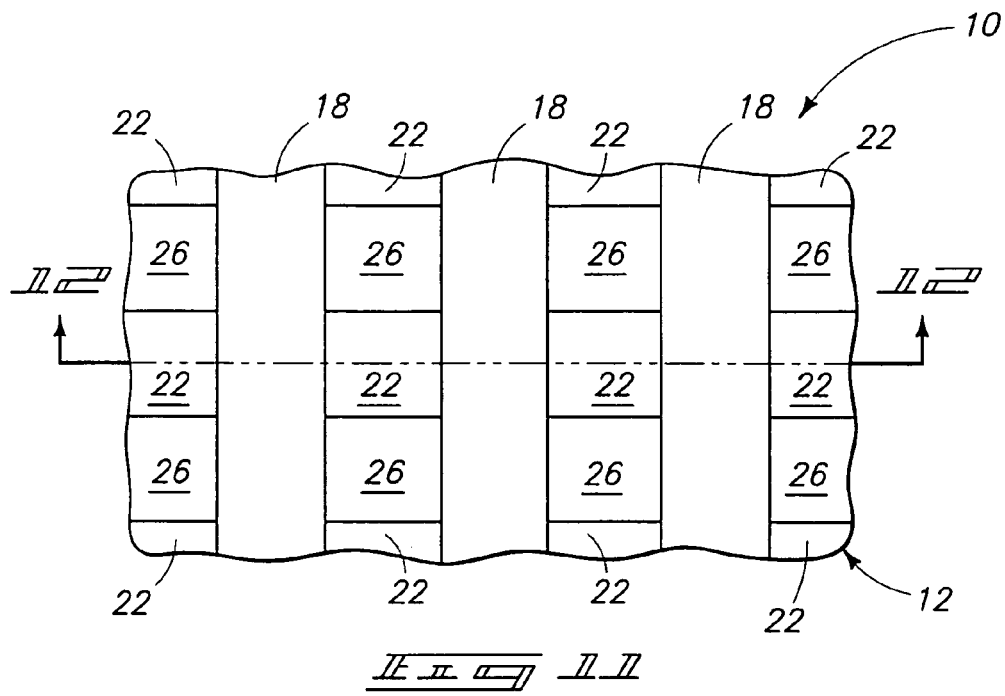
FIG. 11 is a view of the FIG. 9 fragment rotated 90 degrees.
Figure 12:
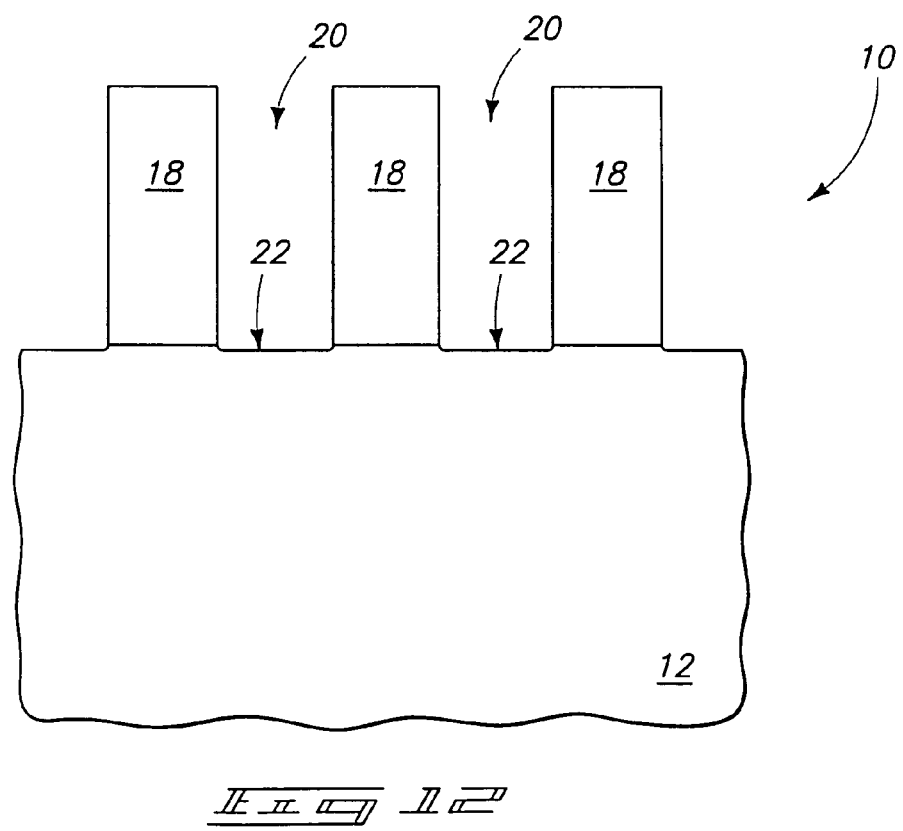
FIG. 12 is a cross-sectional view taken along line 12-12 of the FIG. 11 fragment.
Figure 13:
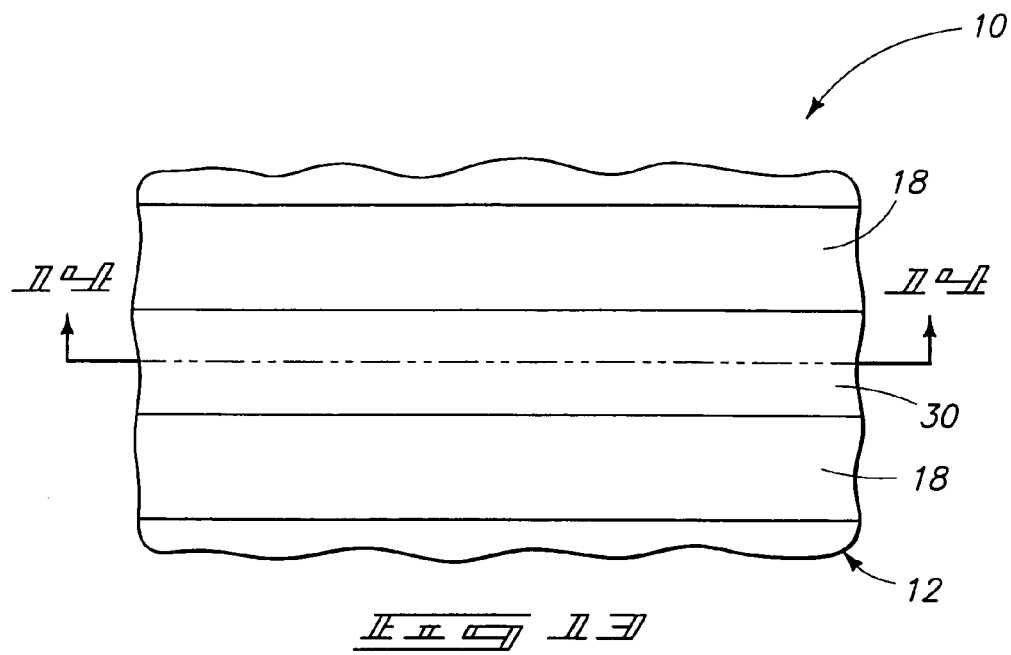
FIG. 13 is a view of the FIG. 9 fragment shown at a processing stage subsequent to that of FIG. 9.
Figure 14:
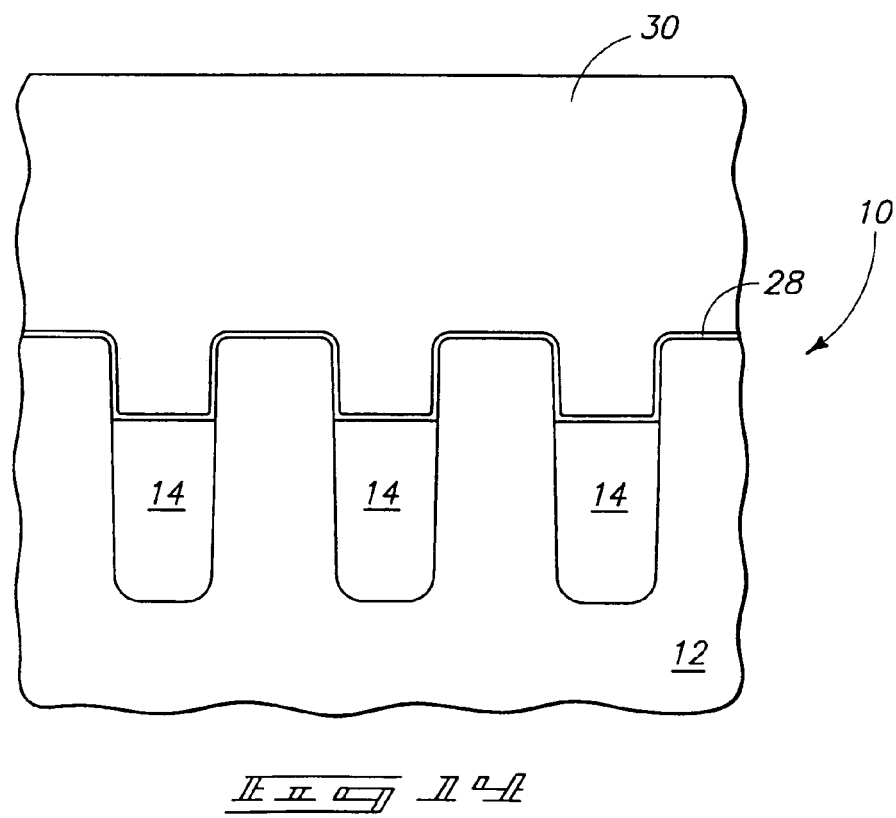
FIG. 14 is a cross-sectional view taken along line 14-14 of the FIG. 13 fragment.
Figure 19:
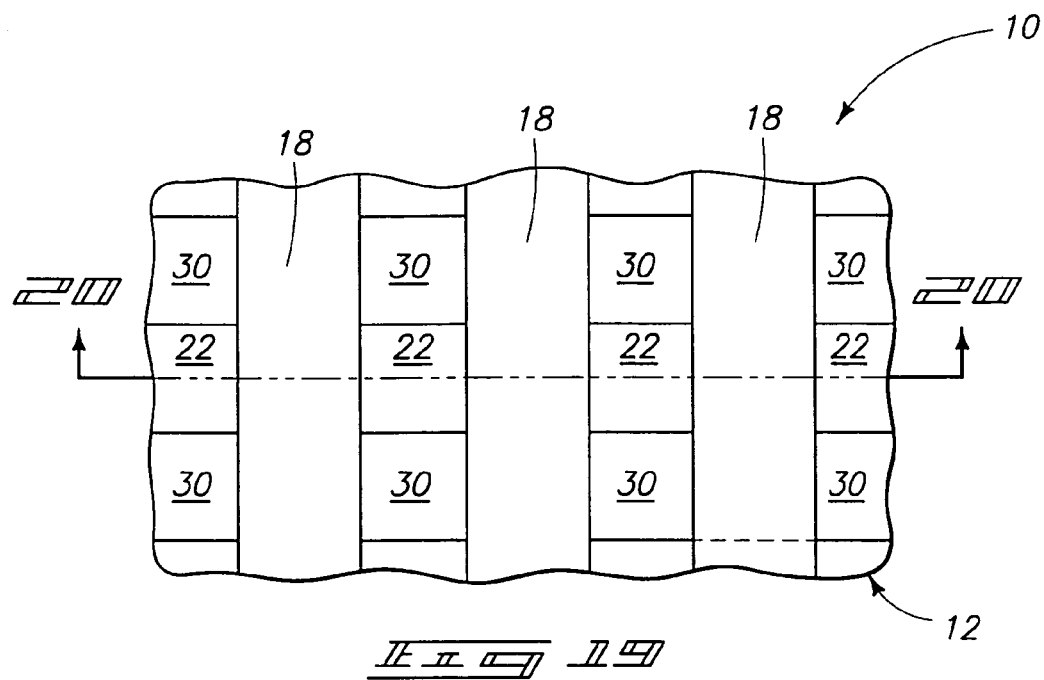
FIG. 19 is a view of the FIG. 17 fragment rotated 90 degrees.
Figure 20:
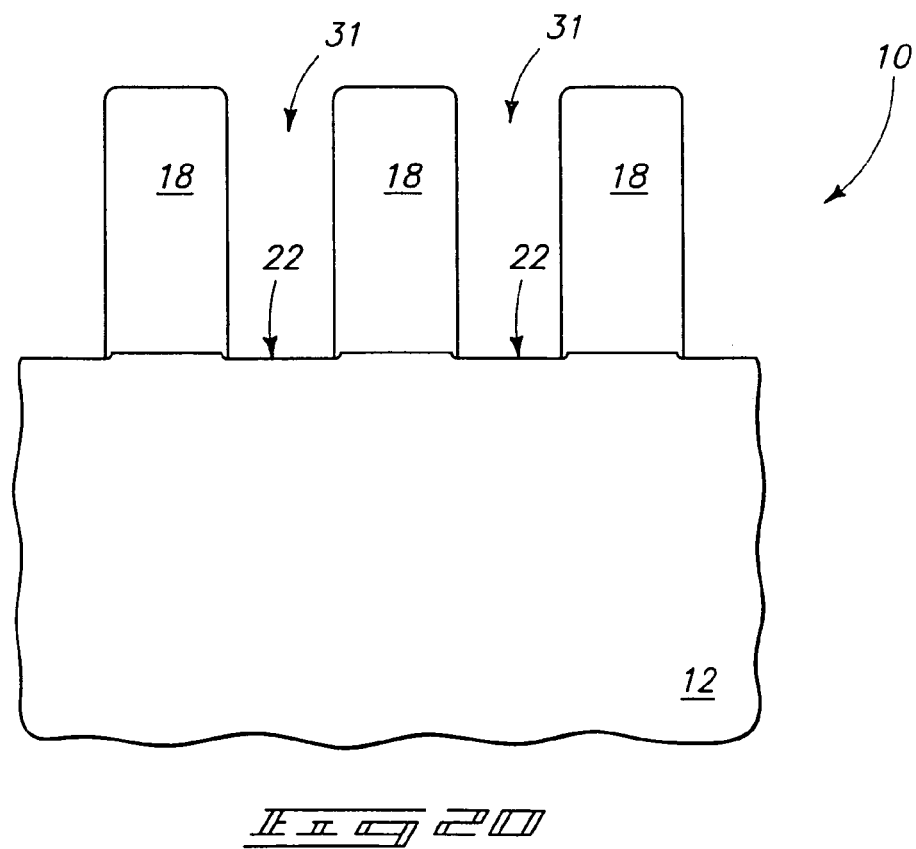
FIG. 20 is a cross-sectional view taken along line 20-20 of the FIG. 19 fragment.
Figure 23:
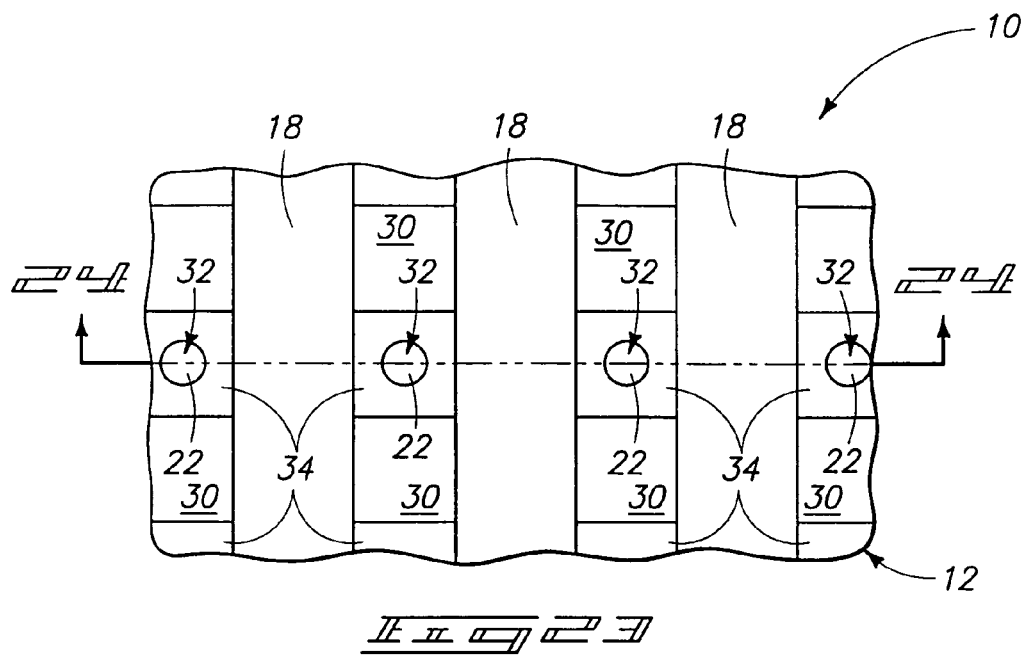
FIG. 23 is a view of the FIG. 21 fragment rotated 90 degrees.
Figure 24:
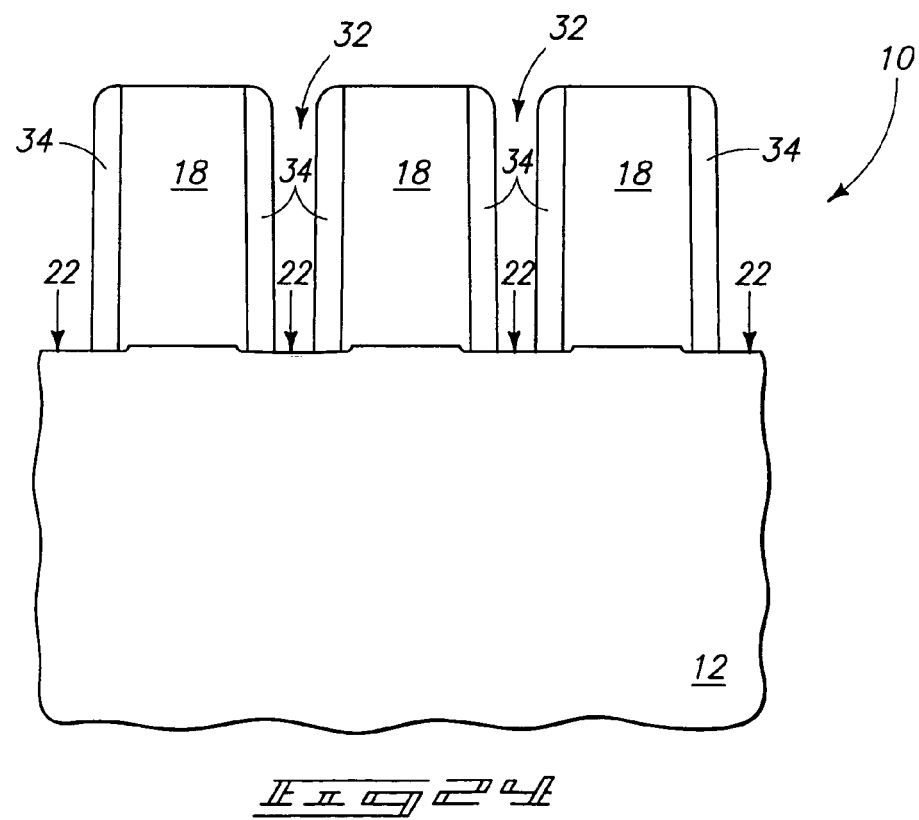
FIG. 24 is a cross-sectional view taken along line 24-24 of the FIG. 23 fragment.
Figure 25:
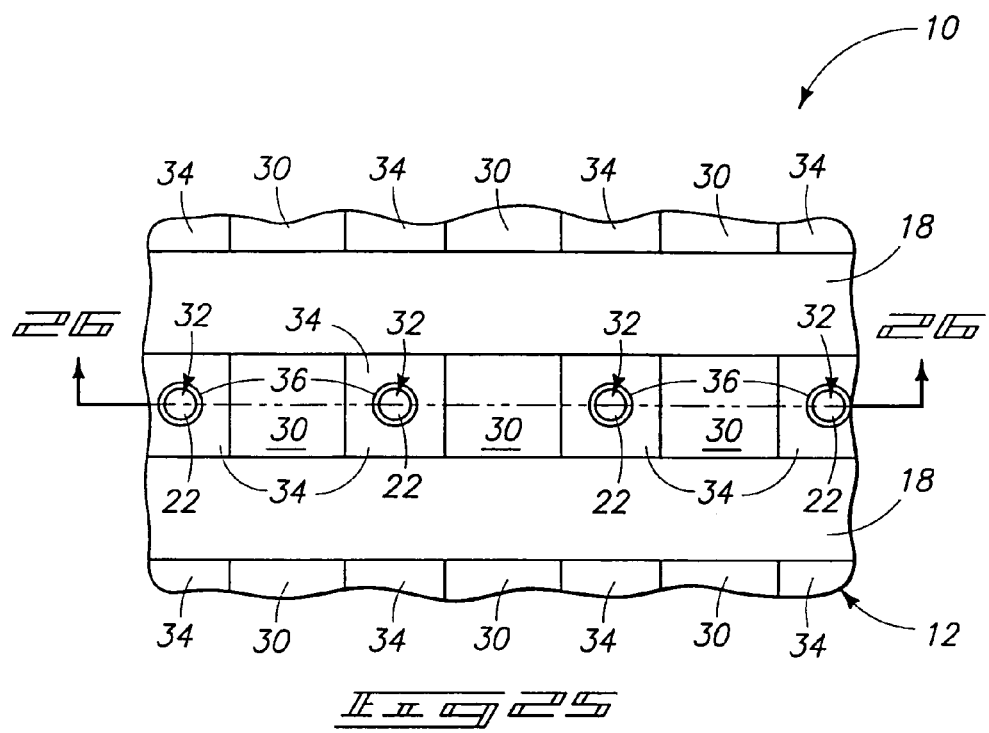
FIG. 25 is a view of the FIG. 21 fragment shown at a processing stage subsequent to that of FIG. 21.
Figure 26:
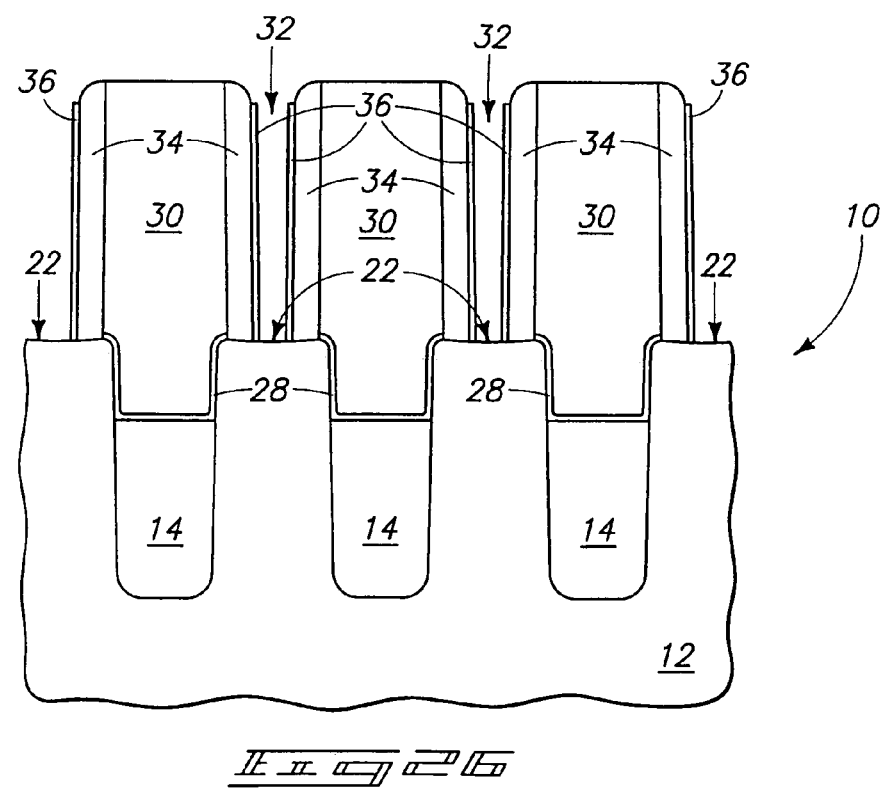
FIG. 26 is a cross-sectional view taken along line 26-26 of the FIG. 25 fragment.
Figure 27:
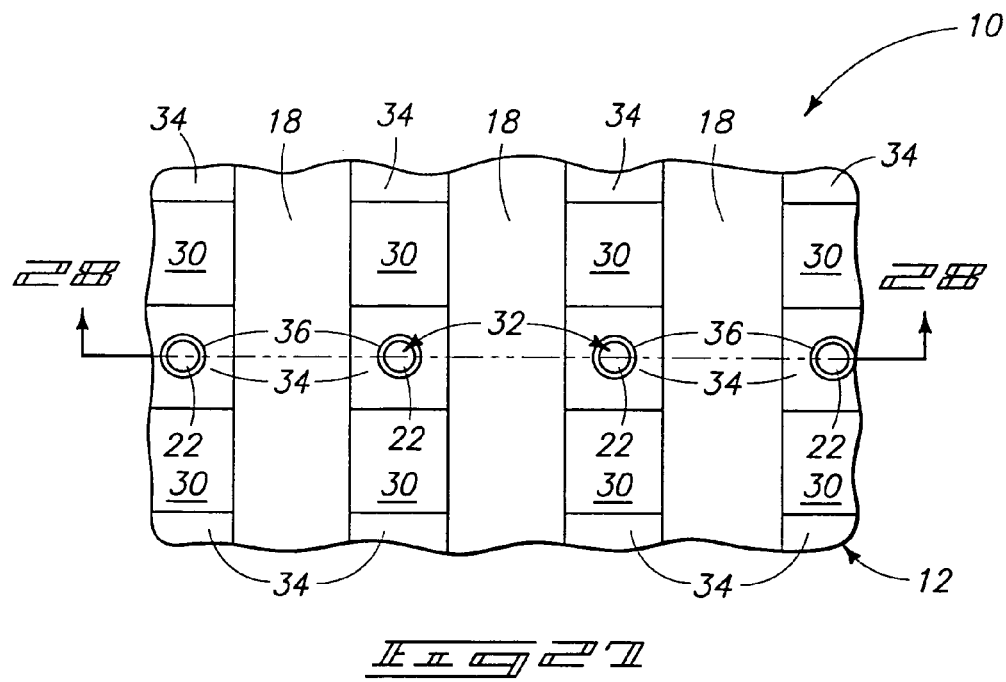
FIG. 27 is a view of the FIG. 25 fragment rotated 90 degrees.
Figure 28:
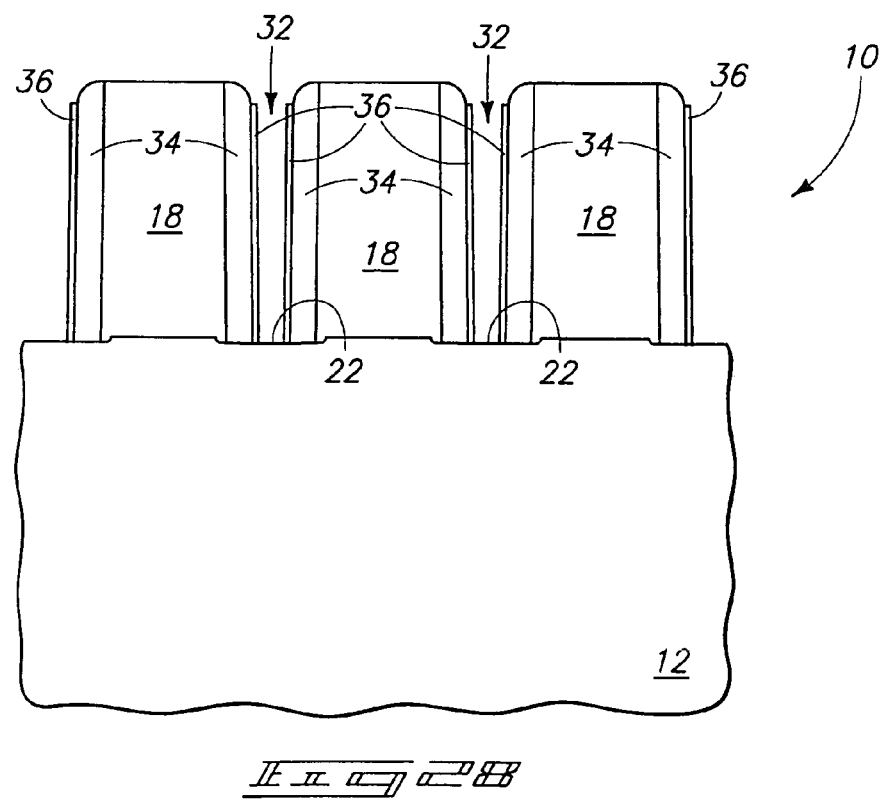
FIG. 28 is a cross-sectional view taken along line 28-28 of the FIG. 27 fragment.
Figure 31:
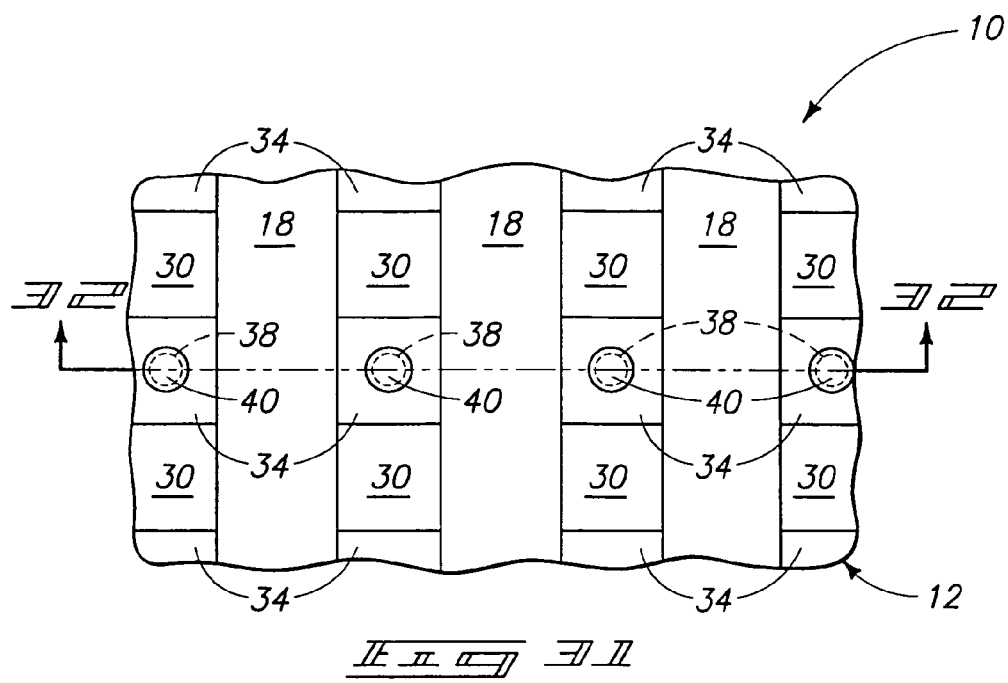
FIG. 31 is a view of the FIG. 29 fragment rotated 90 degrees.
Figure 32:
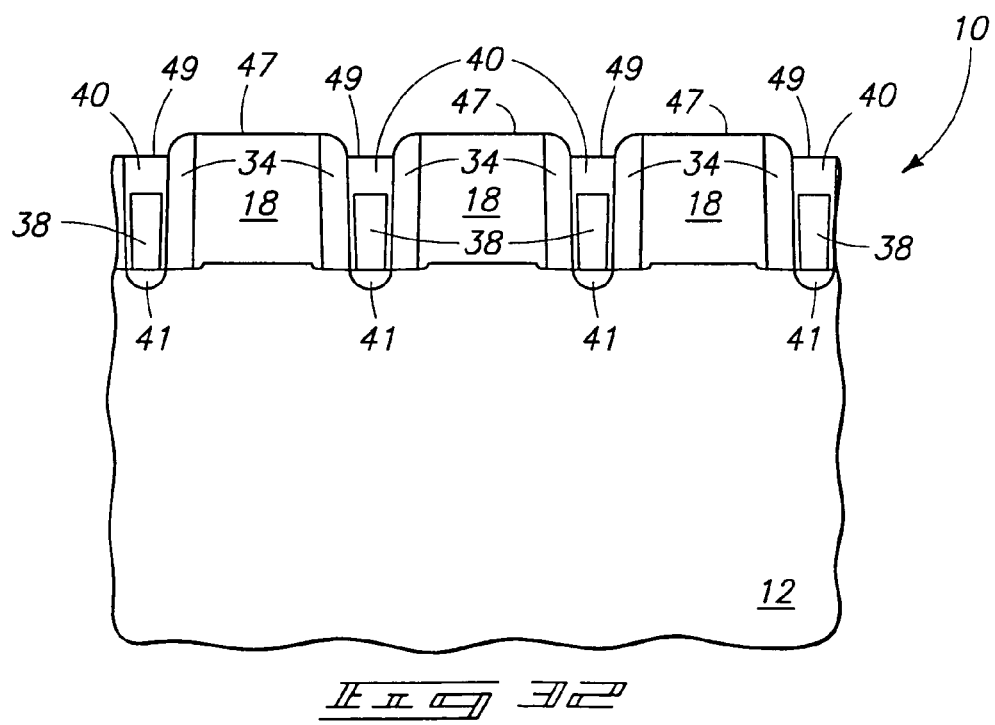
FIG. 32 is a cross-sectional view taken along line 32-32 of the FIG. 31 fragment.
Figure 35:
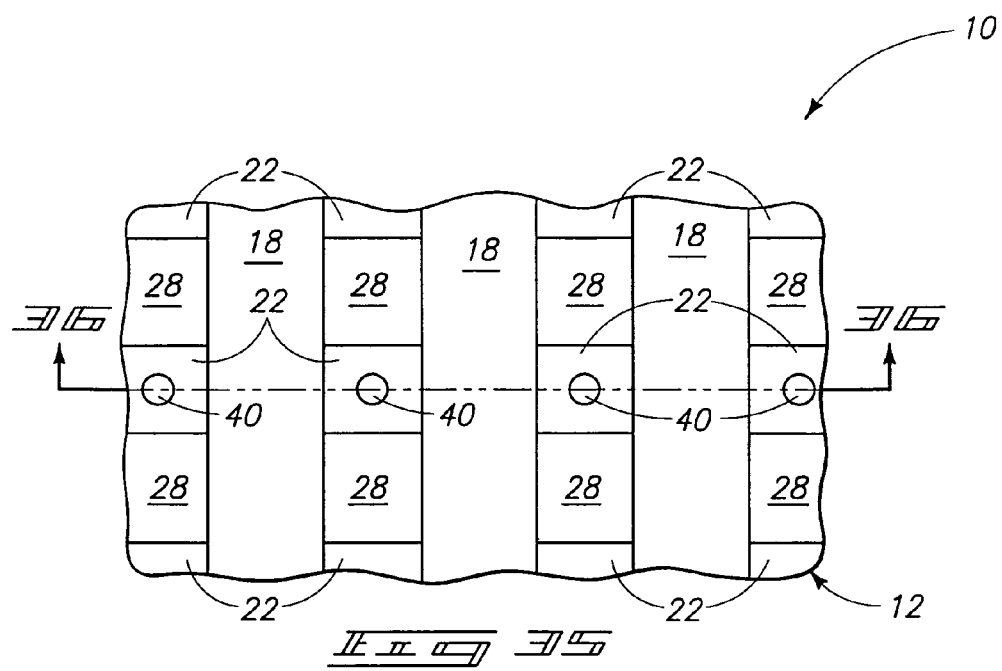
FIG. 35 is a view of the FIG. 33 fragment rotated 90 degrees.
Figure 36:
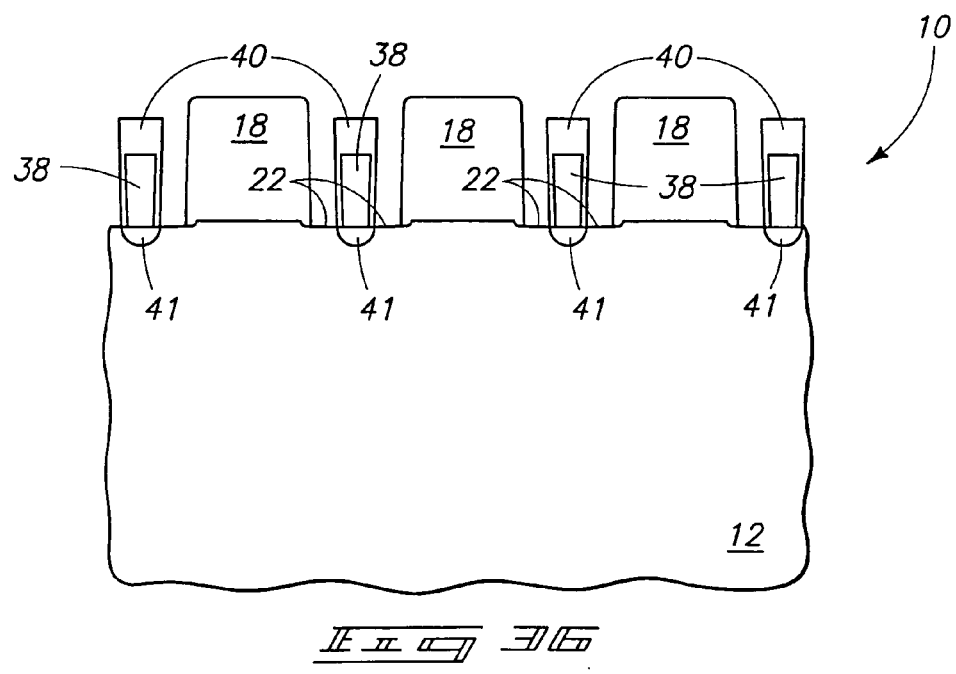
FIG. 36 is a cross-sectional view taken along line 36-36 of the FIG. 35 fragment.
Figure 37:
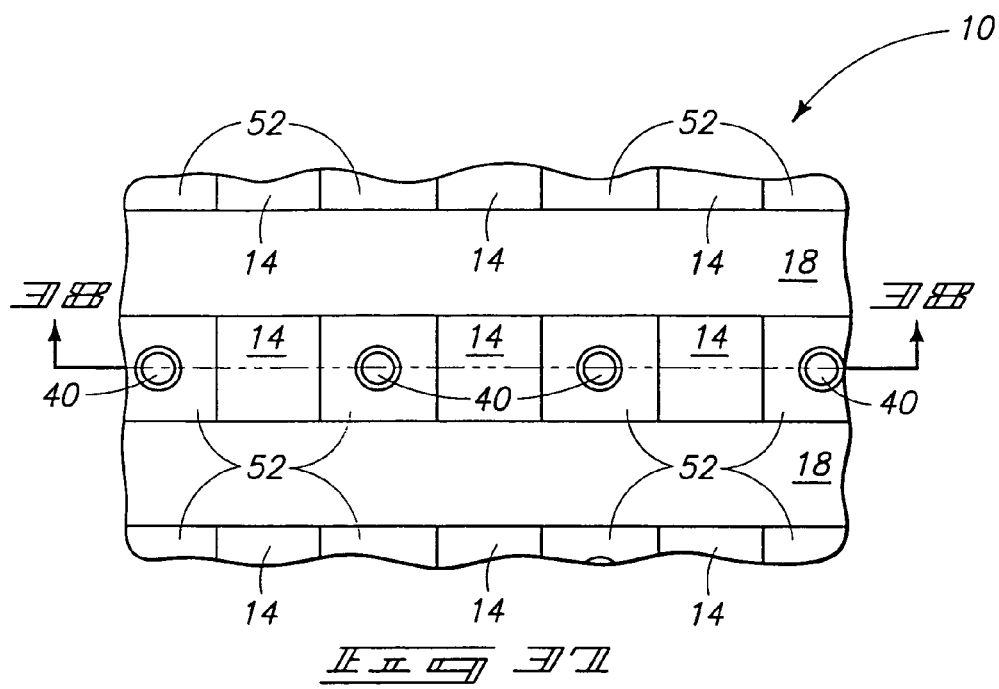
FIG. 37 is a view of the FIG. 33 fragment shown at a processing stage subsequent to that of FIG. 33.
Figure 38:
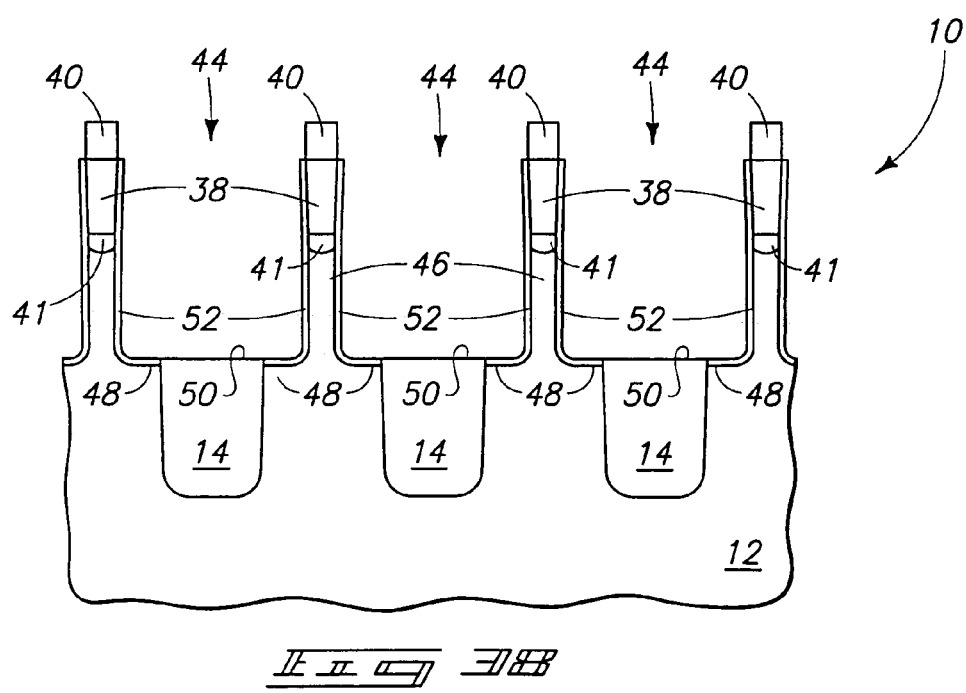
FIG. 38 is a cross-sectional view taken along line 38-38 of the FIG. 37 fragment.
Figure 39:
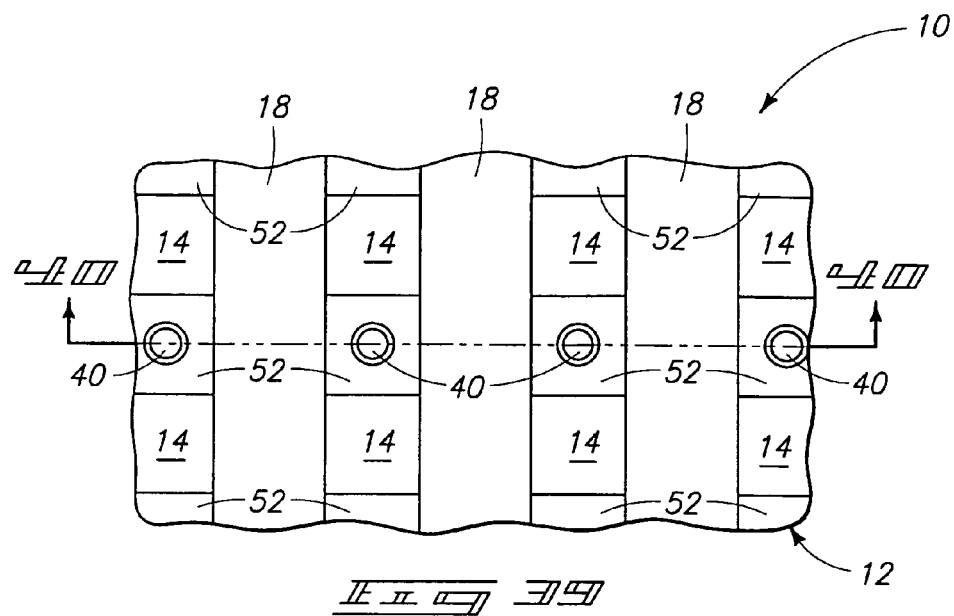
FIG. 39 is a view of the FIG. 37 fragment rotated 90 degrees.
Figure 40:
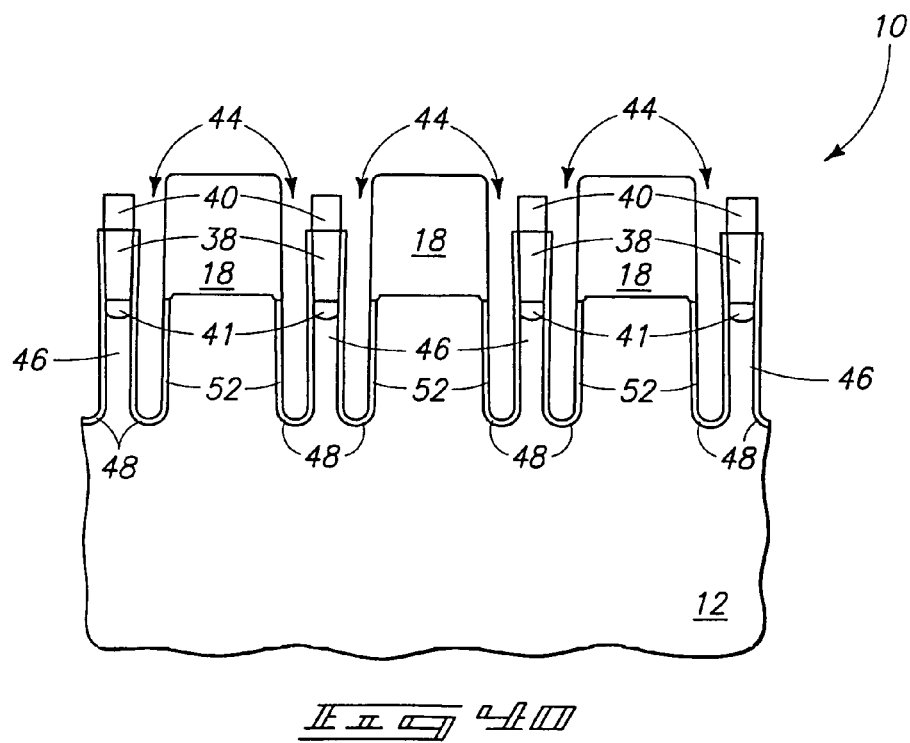
FIG. 40 is a cross-sectional view taken along line 40-40 of the FIG. 39 fragment.
Figure 47:
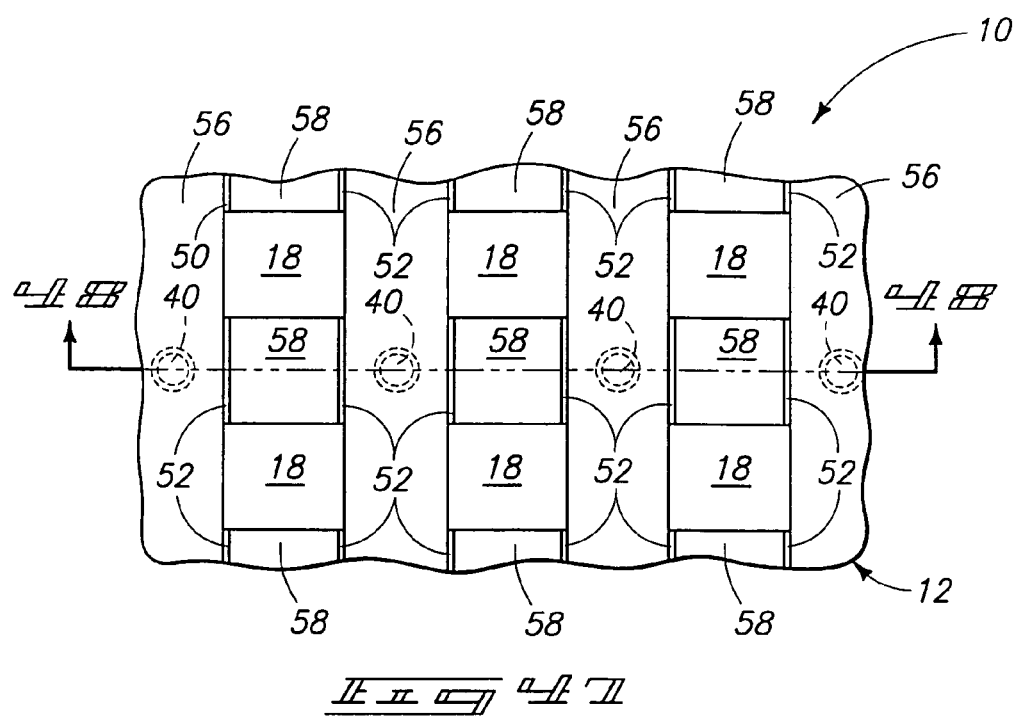
FIG. 47 is a view of the FIG. 45 fragment rotated 90 degrees.
Figure 48:
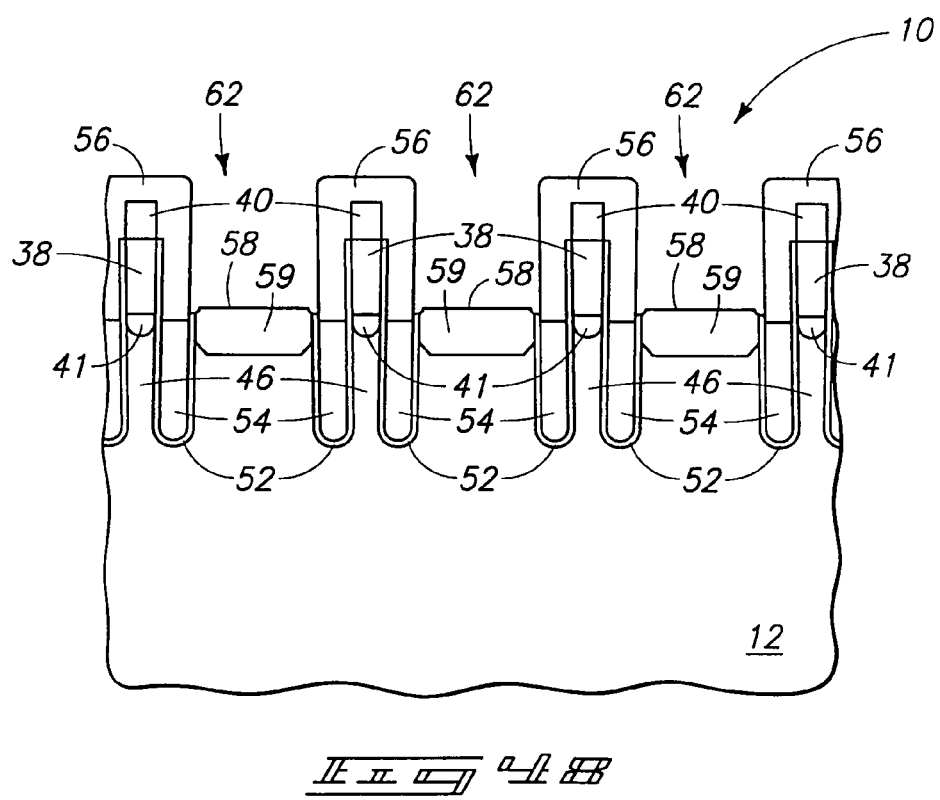
FIG. 48 is a cross-sectional view taken along line 48-48 of the FIG. 47 fragment.

Referring to FIGS. 9-12, isolation region portions 24 are etched to recess isolation regions 14 elevationally below upper surface portions 22 of substrate 12 leaving recessed surfaces 26 of isolation regions 14 (FIG. 10). In one exemplary embodiment, the etch process comprises a Reactive Ion Etch (R.I.E.) and would be selective to the nitride runners 18 and exposed silicon of substrate 12, for example, upper surface portions 22. The recess etch exposes sidewalls 27 of substrate 12 which were originally covered by the insulative material of isolation regions 14. The isolation regions 14 are recessed from a range of about 500 to about 1,500 angstroms below upper surface portions 22 with another exemplary recess range of about 800 to about 1,500 angstroms. In one exemplary embodiment, a recess distance between recessed surfaces 26 and upper surface portions 22 equals about 1,000 angstroms. A clean etch is performed to remove residual oxide from over sidewalls 27 and upper surface portions 22 of substrate 12 with an exemplary clean etch being a wet hydrofluoric (HF) etch.

Referring to FIGS. 13-16, a nitride liner 28 is provided over substrate 12 and structures formed thereon to protect exposed portions of isolation regions 14 (e.g., recessed surfaces 26 illustrated in FIGS. 9-12). In one exemplary embodiment, a thickness for nitride liner 28 ranges from about 30 to about 100 angstroms. A sacrificial layer 30, for example, a spin-on-glass (SOG) layer is provided to fill trenches 20 between nitride runners 18. Other exemplary materials for sacrificial layer 30 includes borophosphorus silicate glass (BPSG) and/or a TEOS layer. A planar etch is performed to planarize the SOG layer 30 until the planar etch stops at nitride rows 18 wherein nitride rows 18 function as an etch stop. An exemplary planar etch comprises CMP (chemical mechanical polishing) processing.

Referring to FIGS. 17-20, the SOG layer 30 is patterned and selectively etched to remove portions of SOG layer 30 to form openings 31 through the SOG layer 30 to expose nitride liner 28 over upper surface portions 22 of substrate 12. Exemplary configurations of exposed portions of nitride liner 28 are squares. Portions of SOG layer 30 remain as towers extending upward from substrate 12 between nitride runners 18 with exemplary configurations for the towers being rectangular. The exposed portions of the nitride liner 28 are removed to expose the upper surface portions 22 of substrate 12. An exemplary etch to remove the portions of nitride liner 28 from over upper surface portions 22 includes a selective nitride etch. After removal of the portions of nitride liner 28 from over upper surface portions 22, openings 31 extend to upper surface portions 22 and are defined or bordered by the towers of SOG layer 30 and nitride rows 18. An exemplary selective nitride etch will over-etch nitride, for example nitride rows 18, from 0 to about 300 angstroms and preferably stop at silicon substrate 12. In one exemplary embodiment, the exposed upper surface portions 22 of substrate 12 define general surface areas of substrate 12 that will serve or function as active areas for subsequently formed devices and/or structures.

Referring to FIGS. 21-24, a blanket insulative layer, for example a TEOS layer, is formed over silicon substrate 12 and fills openings 31. The exemplary TEOS layer is anisotropically etched to form sacrificial TEOS spacers 34 over nitride rows 18 and SOG layer 30. An exemplary etch includes a reactive ion etch leaving sacrificial TEOS spacers 34 laterally extending from about 200 to about 500 angstroms from the sides of nitride rows 18 and SOG layer 30. The sacrificial TEOS spacers 34 narrow openings 31 leaving generally cylindrical openings 32 exposing a smaller surface area of upper surface portions 22. In one exemplary embodiment, TEOS spacers 34 improve the critical dimensions possible for subsequently formed structures provide over or upon upper surface portions 22 of silicon substrate 12.

Referring to FIGS. 25-28, in some but not all embodiments, a nitride material is provided over silicon substrate 12 to fill cylindrical openings 32 and then anisotropically etched to form another nitride liner 36 (the first nitride liner being 28) over sacrificial TEOS spacers 34. An exemplary anisotropic etch will provide a nitride liner 36 having a thickness ranging from about 50 to about 200 angstroms. After the anisotropically etch to form nitride liner 36, a reactive ion etch is performed to remove nitride liner 36 from over upper surface portions 22 of silicon substrate 12 wherein upper surface portions 22 of silicon substrate 12 are again exposed. In one exemplary embodiment, the nitride liner 36 will protect TEOS spacers 34 during subsequent etch processing and/or during subsequent silicidation processing.

Referring to FIGS. 29-32, in an exemplary embodiment, further etching and planarization processing can be performed to elevationally lower the upper surfaces of nitride rows 18 and SOG layer 30 relative silicon substrate 12 to a pre-selected elevation or height above upper surface portions 22. Such pre-selected height of nitride rows 18 and SOG layer 30 facilitates the formation of a pre-selected height of subsequently formed epitaxial structures relative substrate 12. Posts or pillars 38 are formed extending upward from exposed upper surface portions 22 of silicon substrate 12 through cylindrical openings 32. In one exemplary embodiment, posts or pillars 38 comprise epitaxial silicon grown or formed from exposed upper surfaces portions 22 of silicon substrate 12. Posts 38 have upper surfaces 39 and, in one exemplary embodiment, upper surfaces 39 are formed elevationally below upper surfaces 47 of nitride rows 18 with an exemplary elevational difference being about 1,000 to about 1,500 angstroms. Exemplary posts 38 comprise a height (measured from about upper surface portions 22 to upper surface 39) of about 1,000 to about 1,500 angstroms. Alternatively, an exemplary height of epitaxial silicon posts 38 can be considered in terms of a percentage height relationship relative the height of nitride rows 18 extending from silicon substrate 12. For example, epitaxial silicon posts 38 are formed to extend from upper surface portions 22 to be within about 50% to about 70% of the height of nitride rows 18, and a further exemplary range of about 60% to about 65% of the height of nitride rows 18. In some embodiments, epitaxial silicon posts 38 will serve or function as an electrical contact between a charge storage device or data storage element (such as, for example, a capacitor device) and a transistor formed in subsequent processing, and explained more thoroughly below. Alternatively considered, posts 38 will serve or function as a node region, for example a source/drain region, discussed more thoroughly subsequently.

An exemplary alternative process to forming epitaxial silicon posts 38 is to deposit a conductive material over substrate 12 wherein cylindrical openings 32 are filled with the conductive material. In this alternative process, conductive material extending outward of cylindrical openings 32 is removed by exemplary planar or blanket etching, preferably down to upper surfaces 47 of nitride rows 18. The conductive material is then recessed into the cylindrical openings 32 leaving the conductive material elevationally below upper surfaces 47 of nitride rows 18 with an exemplary elevational difference being about 1,000 to about 1,500 angstroms. An exemplary conductive material includes undoped or doped polysilicon wherein the undoped polysilicon would be doped at some stage of the processing.

Still referring to FIGS. 29-32, a conductivity implant (not shown) is performed to provide a conductivity dopant into upper surface portions 22 of substrate 12 to form diffusion regions or nodes 41. In one exemplary embodiment of the implant methods, the conductivity dopant is implanted substantially through posts 38 leaving substantially an entirety of the conductivity dopant within silicon substrate 12. Alternatively, a portion of the conductivity dopant remains in posts 38 to leave posts 38 electrically conductive forming a portion of the diffusion regions or nodes 41. Exemplary diffusion regions 41 comprise source/drain regions, for example, drain regions. In another exemplary embodiment, posts 38 are conductively doped but do not form a portion of diffusion regions or nodes 41, and therefore, form electrical contacts between diffusion regions or nodes 41 of subsequently formed transistors and capacitors. In another still exemplary embodiment, posts 38 and diffusion regions 41 comprise an entirety of one of a pair of source/drain regions of a transistor with posts 38 electrically coupled to subsequently formed capacitors. In exemplary processing methods, a conductivity implant (not shown) is performed to provide a conductivity dopant substantially only into posts 38 and then posts 38 are annealed to out-diffuse conductivity dopant from posts 38 into silicon substrate 12 to form at least a portion of diffusion regions 41. In alternative exemplary embodiments, diffusion regions 41 are not formed wherein a conductivity implant (not shown) is performed to provide a conductivity dopant substantially only into posts 38 wherein posts 38 comprise an entirety of a one of a pair of source/drain regions. Alternatively, diffusion regions 41 comprise a portion of one of a pair of source/drain regions and posts 38 comprise another portion of the one of the pair of source/drain regions.

It should be understood that exemplary posts 38 are generally annular or cylindrical in shape and may or may not have empty space between optionally formed nitride liners 36 and/or TEOS spacers 34. A nitride material 40 is provided over substrate 12 and in cylindrical openings 32 to fill any empty space between posts 38, nitride liners 36 and/or TEOS spacers 34 and provide nitride material 40 over posts 38 and SOG layer 30. Nitride material 40 is etched back to form upper surfaces 49 that are recessed elevationally below the upper surfaces 37 of SOG layer 30 and below the upper surfaces 47 of nitride runners 18 (nitride material 40 is shown as having incorporated optional nitride liners 36). Exemplary etches to recess nitride material 40 includes a planar or blanket reactive ion etch which recesses nitride material 40 to expose SOG layer 30 and TEOS spacers 34. An exemplary nitride material 40 is a sacrificial layer that serves as a barrier or hard mask 40 to protect epitaxial silicon posts 38 during subsequent processing, for example, removal of SOG layer 30 and TEOS spacers 34.

Referring to FIGS. 33-36, a wet or vapor etch is performed to remove the SOG layer 30 and the TEOS spacers 34, and preferably to remove the SOG layer 30 and the TEOS spacers 34 entirely. An exemplary etch includes a selective etch to stop etching at nitride and silicon materials such as nitride liner 28, hard mask 40, nitride runners 18 and upper surface portions 22 of silicon substrate 12. The selective etch forms openings 42 defined by nitride liner 28, posts 38 (including hard mask 40), and nitride runners 18. Exemplary selective etches include a diluted hydrofluoric acid etch and/or a buffered oxide etch.

Referring to FIGS. 37-40, a dry/wet nitride punch etch is performed to remove nitride liner 28 from over isolation regions 14, silicon substrate 12, and upper surface portions 22. The punch etch also removes portions of hard mask 40 from posts 38. In an exemplary embodiment, the thickness of hard mask 40 directly over posts 38 is substantially greater than the thickness of hard mask 40 over the sides of post 38 to allow the punch etch to remove side portions of hard mask 40 from posts 38 while leaving a substantial portion of hard mask 40 directly over posts 38.

Still referring to FIGS. 37-40, a selective dry etch is performed to remove upper surface portions 22 of substrate 12 adjacent posts 38 and down to isolation regions 14. The selective etch also removes portions of isolation regions 14 and leaves portions of silicon substrate 12 remaining directly below or beneath posts 38 and referred to as silicon support structures 46. Exemplary silicon support structures 46 are generally annular or cylindrical in shape, similar to posts 38 which extend elevationally above silicon support structures 46. The selective etch enlarges openings 42 to form openings 44 with a bottom periphery defined by silicon support structures 46, upper surface 48 of silicon substrate 12, and upper surface 50 of isolation regions 14. In one exemplary embodiment, the punch etch will etch or recess the silicon substrate 12 to slightly below the upper surface 50 of isolation regions 14 leaving upper surface 48 elevationally below upper surface 50.

Still referring to FIGS. 37-40, an insulative film 52, for example an oxide, is formed over exposed portions of silicon substrate 12 and exposed portions of posts 38. The exposed portions of silicon substrate 12 include the bottom periphery of openings 44 defined by upper surfaces 48 and silicon support structures 46. The exposed portions of posts 38 include the sidewalls of posts 38. In one exemplary embodiment, insulative film 52 will comprise silicon dioxide and serve or function as a gate oxide or gate dielectric for subsequently formed transistors. An exemplary method of forming gate dielectrics 52 includes growing oxide on the exposed silicon surfaces of the upper surfaces 48, silicon support structures 46 and sidewalls of posts 38.

In one exemplary embodiment, silicon support structures 46 will serve or function as portions of channels for subsequently formed transistors. Accordingly, the length of silicon support structures 46, measured from the bottom portion of posts 38 to upper surface 48, will generally define a vertical length of a subsequently formed transistor channel 46. Moreover, since the transistor channel 46 extends in a generally vertical or perpendicular orientation relative the orientation of substrate 12, and alternatively stated, since the transistor channel 46 extends perpendicularly to the horizontal or primary upper surface of substrate 12 (upper surface portions 22 not shown but existing as the interface between posts 38 and substrate 12), the transistor channel 46 will define an exemplary vertical transistor design in exemplary embodiments. Additionally, exemplary vertical transistor designs will include vertical surrounding transistors or vertical-surrounding-gate transistors in exemplary embodiments. It should be understood that the length of transistor channel 46 (alternatively referred to as vertical channel 46) will depend on the selective etch processing step, for example, the length of time the selective etch is allowed to remove and etch down into silicon substrate 12 (i.e., the depth of the selective etch into substrate 12).

Referring to FIGS. 41-44, a conductive material is deposited over gate dielectrics 52 and will serve or function as transistor gates or word lines 54. An exemplary method of forming conductive material for transistor gates 54 includes depositing polysilicon material within openings 44, removing portions of the polysilicon material by CMP processing down to nitride runners 18, and then recessing the polysilicon material within openings 44 to below epitaxial silicon posts 38. For example, an upper surface 55 of transistor gates 54 is formed about 1,000 angstroms elevationally below upper surfaces 39 of epitaxial silicon posts 38. In one exemplary embodiment, polysilicon material of transistor gates 54 is recessed to form upper surfaces 55 elevationally below an upper surface of substrate 12 (for example, the interface between posts 38 and substrate 12). An optional silicide layer (not shown) is formed over transistor gates 54 with exemplary suicides comprising titanium silicide and cobalt silicide.

Referring to FIGS. 45-48, an insulative material or layer 56 is formed over silicon substrate 12, gate structures 54, epitaxial silicon posts 38 and nitride runners 18. Insulative layer 56 fills openings 44. Exemplary insulative layer 56 includes spin-on-glass layers and TEOS layers. Outermost portions of insulative layer 56 is removed by CMP or other planar etching methods to expose nitride runners 18 leaving insulative layer 56 extending in a line configuration between respective nitride runners 18. Next, nitride runners 18 are patterned and selectively etched to form openings 62 extending through portions of nitride runners 18 to expose upper surface portions 58 of substrate 12. It should be understood that portions of nitride runners 18 remain extending upward from and over silicon substrate 12. Exemplary upper surface portions 58 of silicon substrate 12 are configured generally as squares and bordered or surrounded by insulative layers 56 and the portions of nitride runners 18 that remain over silicon substrate 12. A conductivity implant (not shown) is performed to provide a conductivity dopant into upper surface portions 58 of substrate 12 to form active areas 59, for example, diffusion regions or nodes. In one exemplary embodiment, diffusion regions 59 will comprise source/drain regions 59 for subsequently formed devices, for example, transistors. In still another exemplary embodiment, diffusion regions 59 will comprise source/drain regions to complement and in operative cooperation with diffusion regions or nodes 41. Exemplary diffusion regions 59 comprise one of a pair of source/drain regions, for example, source regions.

Figure 49:
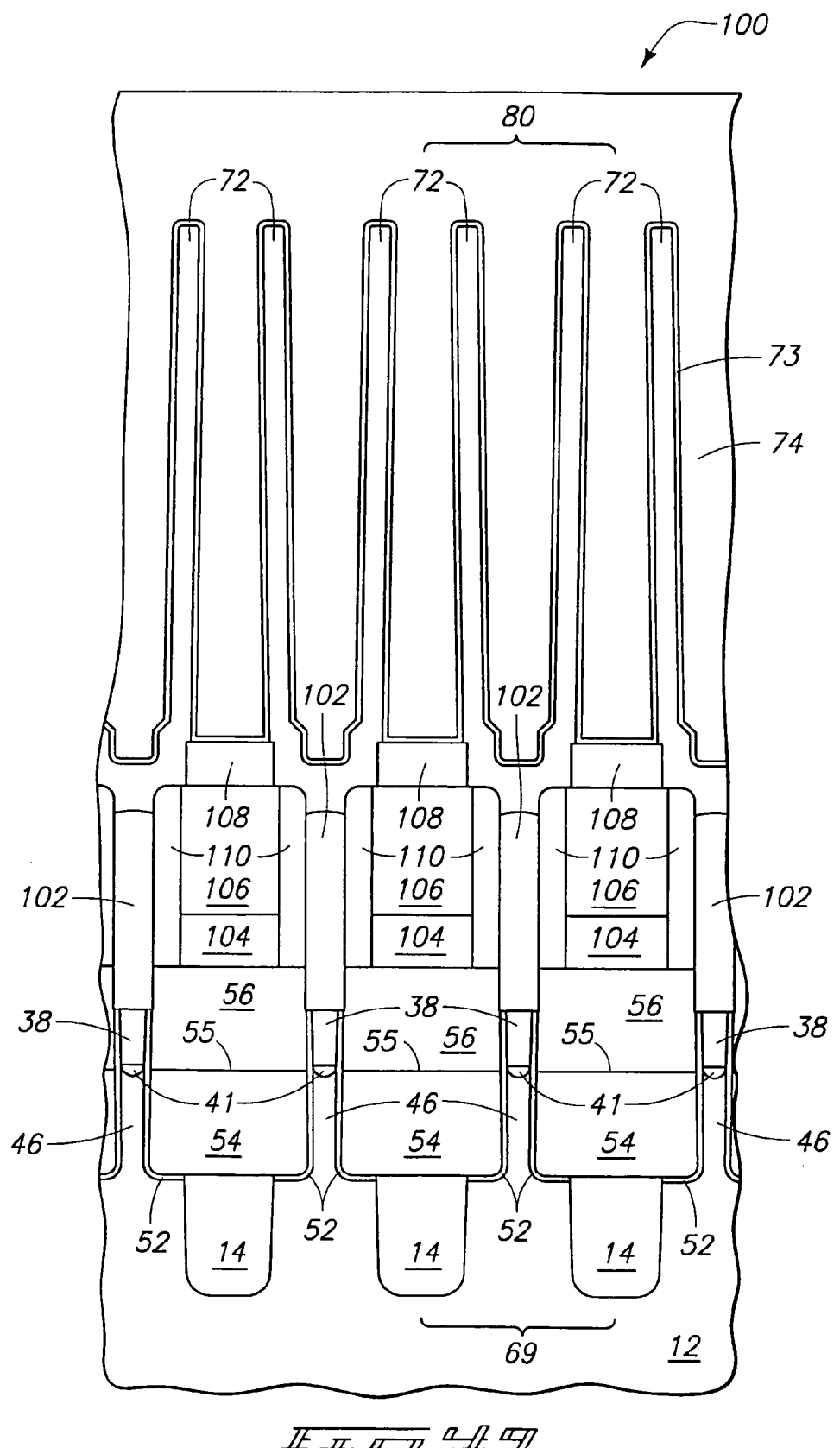
FIG. 49 is a cross-sectional fragmentary view of a semiconductor construction at a final processing stage of one exemplary embodiment of the present invention at a processing stage subsequent to that of FIGS. 45-48.

Referring to FIGS. 49-50, such illustrates a semiconductor construction 100 according to some exemplary embodiments at a processing stage subsequent to the processing stages of FIGS. 1-48, for example, subsequent to the processing stages of FIGS. 45-48. FIG. 49 represents a view orientation of semiconductor construction 100 similar to the view orientation of FIG. 46 at a subsequent processing stage. FIG. 50 represents a view orientation of semiconductor construction 100 similar to the view orientation of FIG. 48 at a subsequent processing stage. It should be understood that FIG. 50 is a view of the semiconductor construction 100 of FIG. 49 and rotated 90° from the orientation of the view for FIG. 49. FIGS. 49-50 illustrate exemplary transistor devices electrically coupled with exemplary charge storage devices or data storage elements, for example, capacitor devices. Such exemplary combinations of transistors and capacitors are representative of memory and/or logic circuitry comprising memory cells such as DRAMs. An exemplary transistor device is referenced generally as numeral 69 and an exemplary charge storage device or data storage element, for example, a capacitor device is referenced generally as numeral 80.

An exemplary transistor 69 comprises a gate 54, a gate dielectric 52 and source/drain regions 41 and 59 (FIG. 50). Exemplary transistor 69 further includes a channel represented generally as the region of substrate 12 where current flow 71 is illustrated in FIG. 50 extending around gate 54 (and gate dielectric 52) from source/drain region 59 to source/drain region 41. An exemplary portion of the channel comprises silicon support structures 46 that extend directly elevationally below source/drain regions 41. Exemplary channel portions defined by silicon support structures 46 are cylindrical or annular portions of silicon substrate 12. Gate 54 extends generally vertically downward into substrate 12 generally perpendicularly to an upper surface of silicon substrate 12 (upper surface represented generally as the horizontal top lines of source/drain regions 41 and 59, for example, the interface between posts 38 and source/drain regions 41). Gate 54 is spaced and insulated from silicon substrate 12 by gate dielectric 52. Gate 54 extends vertically relative silicon substrate 12. However, it should be understood that gate 54 surrounds or encircles the channel portion defined by silicon support structures 46. Accordingly, an exemplary gate 54 will define a vertical-surrounding-gate for a vertical transistor, for example, a vertical-surrounding-gate transistor. In an exemplary embodiment, if posts 38 are defined as electrical contacts and not as source/drain regions, an entirety of transistor 69 is formed within the silicon substrate or bulk wafer 12.

Alternatively stated, transistor 69 is formed at or below an uppermost surface of wafer 12.

Exemplary source/drain regions 41 comprise drain regions. Exemplary source/drain regions 59 comprise source regions. In one exemplary embodiment, a single source/drain region 59 will comprise an entirety of the source region for transistor 69. In another exemplary embodiment, a pair of source/drain regions 59 formed on opposite sides of gate 54 will comprise an entirety of the source region for transistor 69. In one embodiment, activation of transistor 69 establishes current flow 71 from source region 59 downward through silicon substrate 12 below and around a bottom end of gate 54 and back upward through the channel portion 46 and to drain region 41. During processing subsequent to FIGS. 45-48, hard masks 40 directly over posts 38 are removed and portions of insulative layer 56 directly over hard masks 40 are removed to expose upper surfaces of posts 38. Conductive material 102 is formed over and in contact with posts 38 to form an electrical contact. Exemplary conductive material 102 is polysilicon to form polysilicon plugs or cell plugs 102 for electrical coupling transistors 69 via posts 38 to subsequently formed devices, for example, capacitors 80.

An exemplary capacitor 80 comprises a bottom cell plate or storage node 72, a capacitor dielectric 73 over storage node 72, and a top cell plate 74 over capacitor dielectric 73. Capacitor 80 is electrically coupled to transistor 69 by epitaxial silicon post 38 and polysilicon plug 102 with polysilicon plug 102 contacting and electrically coupled to storage node 72. Conductive plugs 61 (FIG. 50) are formed extending upward from and electrically coupled with source/drain regions 59. Conductive plugs 61 also contact portions of digit line 104 to electrically couple digit line 104 to transistors 69 via source/drain regions 59. Exemplary digit lines 104 comprise polysilicon and/or silicide layers. Exemplary conductive plugs 61 comprise doped polysilicon. Insulative spacers 70 (FIG. 50) are formed between conductive plugs 61 and insulative layer 56. Exemplary insulative spacers 70 comprise silicon nitride and/or oxide such as silicon dioxide.

Semiconductor construction 100 comprises intermediate structures between capacitors 80 and transistors 69. Nitride caps 106 are formed over digit line portions 104. Insulative spacers 110 are formed between digit lines 104 and nitride caps 106 on one side and polysilicon plugs 102 on the other side. A silicon dioxide layer 108 is formed over nitride caps 106.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A transistor comprising:
   a gate, a gate dielectric, a pair of source/drain regions, and a channel region;
   the gate comprising a longitudinally oriented conductive line comprising opposing longitudinally elongated sides;
   the channel region comprising a solid semiconductive material post which extends upwardly into the conductive line, and transversely relative to the longitudinal orientation of the conductive line, between the opposing longitudinally elongated sides;
   the gate dielectric encircling the solid semiconductive material post; and
   a portion of the channel region defining a lowermost structure of the transistor.

2. The transistor of claim 1 wherein at least portions of each of the gate, the gate dielectric, the pair of source/drain regions, and the channel region are within bulk semiconductive material of a semiconductor substrate.

3. The transistor of claim 1 wherein the channel region comprises at least three laterally spaced and parallel extending portions, one of the laterally spaced portions comprising the post.

4. The transistor of claim 3 wherein two other of the laterally spaced portions are received on opposing lateral sides of said one of the laterally spaced portions.

5. The transistor of claim 1 wherein one of the pair of source/drain regions comprises an upper portion of the post.

6. The transistor of claim 1 wherein the gate dielectric encircles one of the source/drain regions.

7. The transistor of claim 1 wherein one of the pair of source/drain regions comprises an upper portion of the post, and the gate dielectric encircles said one source/drain region.

8. The transistor of claim 1 wherein the pair of source/drain regions comprise diffusion regions within bulk monocrystalline material, said diffusion regions of the pair having elevationally outermost surfaces which are elevationally coincident with outermost surfaces of the bulk monocrystalline material.

9. A transistor comprising:
   a gate, a gate dielectric, a pair of source/drain regions, and a channel region;
   the channel region comprising a solid vertically extending semiconductive material post;
   one of the pair of source/drain regions comprising an upper portion of the solid vertically extending semiconductive material post;
   the gate dielectric encircling the solid semiconductive material post; and
   a portion of the channel region defining a lowermost structure of the transistor.

10. The transistor of claim 9 wherein the semiconductive material comprises silicon.

11. The transistor of claim 10 wherein the semiconductive material comprises monocrystalline silicon of a bulk monocrystalline silicon substrate.

12. The transistor of claim 9 wherein the pair of source/drain regions comprise diffusion regions within bulk monocrystalline material, said diffusion regions of the pair having elevationally outermost surfaces which are elevationally coincident with outermost surfaces of the bulk monocrystalline material.

13. The transistor of claim 9 wherein at least portions of each of the gate, the gate dielectric, the pair of source/drain regions, and the channel region are within bulk semiconductive material of a semiconductor substrate.

14. The transistor of claim 9 wherein one of the pair of source/drain regions comprises an upper portion of the post.

* * * * *

UNITED STATES PATENT AND TRADEMARK OFFICE
CERTIFICATE OF CORRECTION

PATENT NO. : 7,825,462 B2  
APPLICATION NO. : 12/070078  
DATED : November 2, 2010  
INVENTOR(S) : Sanh D. Tang et al.

Page 1 of 1

It is certified that error appears in the above-identified patent and that said Letters Patent is hereby corrected as shown below:

On the Title page, Item (56), in column 2, under "Other Publications", line 1, delete "Verticle" and insert -- Vertical --, therefor.

Signed and Sealed this

Eleventh Day of January, 2011

David J. Kappos  
*Director of the United States Patent and Trademark Office*